United States Patent
Tashiro et al.

(10) Patent No.: US 7,129,500 B2
(45) Date of Patent: Oct. 31, 2006

(54) IMAGE PICKUP APPARATUS

(75) Inventors: Kazuaki Tashiro, Kanagawa (JP);
Noriyuki Kaifu, Tokyo (JP); Osamu Yuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/917,400

(22) Filed: Aug. 13, 2004

(65) Prior Publication Data
US 2005/0018065 A1    Jan. 27, 2005

Related U.S. Application Data

(62) Division of application No. 10/143,785, filed on May 14, 2002, now Pat. No. 6,855,937.

(30) Foreign Application Priority Data

May 18, 2001 (JP) ............... 2001-149463
May 25, 2001 (JP) ............... 2001-157271

(51) Int. Cl.
*H04N 3/14* (2006.01)
(52) U.S. Cl. .................. 250/370.11
(58) Field of Classification Search ........... 250/370.11, 250/370.09, 208.1, 208.4; 348/308, 305, 348/307, 241, 294, 135, 138, 202, 222, 230
See application file for complete search history.

(56) References Cited

U.S. PATENT DOCUMENTS

| 4,323,925 A | 4/1982 | Abell et al. ............... 358/213 |
|---|---|---|
| 5,315,101 A | 5/1994 | Hughes et al. ............... 250/208 |
| 5,386,108 A | 1/1995 | Arikawa et al. ........... 250/208.1 |
| 5,434,686 A | 7/1995 | Kanemori et al. ............. 359/59 |
| 5,793,047 A | 8/1998 | Kobayashi et al. ..... 250/370.09 |
| 5,998,779 A | 12/1999 | Kozuka .................... 250/208.1 |
| 6,005,911 A | 12/1999 | Cheung ........................ 378/37 |
| 6,118,115 A | 9/2000 | Kozuka et al. ........... 250/208.1 |
| 6,118,851 A | 9/2000 | Endo et al. ................. 378/98.8 |
| 6,127,684 A * | 10/2000 | Kaifu .................... 250/370.09 |
| 6,448,561 B1 * | 9/2002 | Kaifu .................... 250/370.09 |
| 6,528,796 B1 | 3/2003 | Kaifu et al. ............ 250/370.11 |
| 6,597,399 B1 | 7/2003 | Horii ........................... 348/308 |
| 6,605,850 B1 | 8/2003 | Kochi et al. ................. 257/431 |

FOREIGN PATENT DOCUMENTS

| EP | 1 014 683 A2 | 6/2000 |
|---|---|---|
| JP | 8-116004 | 5/1996 |
| JP | 2000-184282 | 6/2000 |

* cited by examiner

*Primary Examiner*—Otilia Gabor
(74) *Attorney, Agent, or Firm*—Fitzpatrick, Cella, Harper & Scinto

(57) ABSTRACT

An image pickup apparatus comprising an image pickup element having pixels arranged in a two-dimensional state, each pixel having a photoelectric conversion portion, a first holding portion for holding a photoelectric conversion signal generated in the photoelectric conversion portion and a second holding portion for holding a noise signal generated in the pixel.

11 Claims, 23 Drawing Sheets

IMAGE PICKUP APPARATUS

This application is a division of U.S. application Ser. No. 10/143,785, filed May 14, 2002 now U.S. Pat. No. 6,855,937.

BACKGROUND OF THE INVENTION

1. Field of the Invention

The present invention relates to an image pickup apparatus for picking up an object image.

2. Related Background Art

In recent years, digitization has made progress in various fields of medical care. In a field of X-ray diagnosis, a two-dimensional X-ray image pickup apparatus for converting incident X-rays to visible light by a scintillator (phosphor) and further picking up an image of such visible light by an image pickup element has been developed for digitization of images.

As the two-dimensional X-ray image pickup apparatus, for example, a compact CCD type image pickup element has been put in practical use for dental use and a large area still image pickup apparatus which uses a maximum 43 cm×43 cm amorphous silicon (a-Si) has also been put in practical use for photographing breasts and chests. In an image pickup element using an amorphous silicon semiconductor on a glass substrate, it is easy to manufacture one with a large area. Some large area X-ray image pickup apparatuses are realized by tessellating four panels of the image pickup element. As an example of this type of technology, there is an apparatus described in U.S. Pat. No. 5,315,101.

In addition, it has been proposed to constitute a large area X-ray image pickup apparatus using a plurality of monocrystal image-pickup elements (silicon image pickup element, etc.). As examples of this type of technology, there are apparatuses described in U.S. Pat. No. 4,323,925 and U.S. Pat. No. 6,005,911. As the monocrystal image pickup element, there are, for example, a CCD type image pickup element and MOS and CMOS type image pickup elements, etc. using silicon. In a field of medical X-ray diagnosis in which digitization has made progress as described above, it is expected that a moving image pickup apparatus (fluoroscopy, etc.) of the next generation of the still image pickup apparatus will be realized.

As technical objects in this field, there are: (1) high sensitivity and high-speed reading technology; (2) increase in size; (3) reduction of costs, and the like. Concerning the objects of high sensitivity and high-speed reading, it is required, for picking up a moving image, to realize high sensitivity and a reading speed that are more than ten times as high as those of an image pickup apparatus using an amorphous silicon. In order to pick up a moving image, X-rays are continuously irradiated on a human. Thus, taking into accounts effects caused by X-ray irradiation, an irradiation amount is required to be reduced to one several tenth to one hundredth and a reading speed is required to be increased to 60 to 90 frames/second. In order to carry out reading at such a speed, sensitivity and high speed several ten times as high as those of the image pickup apparatus using the amorphous silicon are required.

The amorphous silicon does not have a sufficient semiconductor characteristic with respect to a high-speed operation. With a large area image pickup apparatus using the amorphous silicon, micro-machining of a semiconductor on a glass substrate is more difficult compared with a monocrystal silicon semiconductor substrate. As a result, a capacitance of an output signal line increases. This capacitance becomes a largest cause of a noise (kTC noise). A manufacturing process of an amorphous silicon large plate image pickup apparatus is more advantageous in that an element with a larger area as compared with the CCD type image pickup element and the CMOS type image pickup element is obtained. However, its photoelectric conversion portion is not a full depletion type, a driving circuit and an amplifier of an image pickup element are required on the outside (see FIG. 52 of Japanese Patent Application Laid-open No. 8-116004) and judgement of undefective products is required to be carried out after incorporating peripheral parts. Therefore, while the image pickup element itself is relatively low-priced, costs are ultimately high. Due to these reasons, it is difficult to satisfy the above-mentioned requirements.

In addition, the CCD type image pickup element is the full depletion type and has high sensitivity but is unsuitable as a large area image pickup apparatus. The CCD type image pickup element is a charge transfer type, and thus the larger it becomes and as the number of transfer steps increases (higher number of pixels), the more problematic the transfer becomes. That is, driving voltages are different at a driving end and around the center, which makes complete transfer difficult. In addition, power consumption is represented by $CVf^2$ (C is a capacitance between a substrate and a well, V is a pulse amplitude and f is a pulse frequency). The larger an element is, the larger C and V become, whereby the power consumption becomes ten or more times larger than that of the CMOS type image pickup element. As a result, the driving circuit in its periphery becomes a heating source and a noise source and a high S/N is not obtained. Thus, the CCD type image pickup element is not suitable for a large image pickup element in some aspects.

Moreover, with a structure of a simple large area image pickup apparatus using a plurality of monocrystal image pickup elements, a dead space is inevitably generated in a joining portion of each image pickup element (because an area for providing an external terminal, which exchanges signals and power source with peripheral circuits such as a shift register and an amplifier or with the outside, and a guard circuit is always necessary, separately from areas for the image pickup elements). This portion becomes a line defect and decreases an image quality. Thus, a structure is employed which uses a taper-shaped FOP (fiber optic plate) to guide light from a scintillator to the image pickup elements avoiding a dead space. However, a redundant FOP is necessary and manufacturing costs increase. In particular, the taper-shaped FOP is extremely costly. Moreover, light from the scintillator is less easily incident on the FOP according to a taper angle of the taper-shaped FOP and decrease of an output light amount occurs, which offsets sensitivity of the image pickup elements to deteriorate sensitivity of the entire apparatus.

In order to compensate for the above-mentioned drawbacks of the amorphous silicon image pickup element and the CCD-type image pickup element, a structure in which large area CMOS type image pickup elements are tessellated is proposed (Japanese Patent Application Laid-Open No. 2000-184282).

However, a conventional amplification-type image pickup element such as the CMOS type image pickup element has the following inconveniences.

(a) With a general driving method of the amplification-type image pickup element, accumulated electric charges for one horizontal scanning line are sequentially read out with a horizontal scanning line of an identical column as a unit. While the accumulated electric charges are read out from a certain horizontal scanning line, electric charges are accumulated in the remaining horizontal scanning lines. In this case, time for accumulating electric charges is different for each horizontal scanning line. If the electric charges are read out and reproduced as an image, images of different timing for each scanning period are obtained. In photographing of a still image, it is less likely that this difference in the accumulation time becomes a problem. However, in photographing of a moving image, an image is smeared to cause a problem. In particular, in an image pickup apparatus with a plurality of image pickup elements tessellated (an image pickup element panel in which a plurality of pixels are formed), noncontinuity occurs in an image between each image pickup element to cause a significant problem as discussed below. In addition, with X-ray moving image photographing, reading-out time of a certain horizontal scanning line coincides with exposure time of the other horizontal scanning lines and unnecessary X-ray irradiation must be performed partially. Therefore, it is difficult to apply this method to a medical field in which an amount of exposure to radiation should be reduced as much as possible.

(b) There is a method of fixing an accumulation period of electric charges in each horizontal scanning line by providing a mechanical shutter in order to prevent accumulation periods of electric charges from being different in a horizontal scanning line for reading out first and a horizontal scanning line for reading out later. However, this method has a disadvantage that an apparatus is enlarged in size.

Problems in the case where high-speed moving image photographing is performed using an image pickup apparatus in which four large area CMOS type image pickup elements described above are tessellated, in particular, problems relating to the above item (a) will be described below. FIG. 1 shows a plan view of an image pickup apparatus in which four image pickup elements are tessellated. Image pickup areas (image pickup element panels) A1, A2, B1 and B2 are constituted by arranging a plurality of pixel portions in horizontal and vertical directions. Reference symbol Hn in the image pickup areas denotes rows that are scanned by row scanning circuits and Vn denotes columns that are scanned by column scanning circuits. In addition, a row scanning circuit, a column scanning circuit, a memory circuit and an output amplifier are provided for each image pickup area.

FIG. 2 shows a schematic structure of one pixel portion and a signal reading-out circuit of each image pickup element. In FIG. 2, a method for scanning each column to read out a signal is employed. In addition, in a conventional circuit of FIG. 2, a signal reading-out circuit is a dual sampling circuit as described in detail later. In FIG. 2, reference symbol VSR denotes a column scanning circuit and HSR denotes a row scanning circuit. In addition, reference symbol PD denotes a photodiode, TR1 denotes a transfer switch, TR2 denotes a reset switch, TR3 denotes a column selection switch, TR4 denotes an amplification transistor, TR5 denotes a switch for resetting a signal line, TR6 and TR7 denote sample switches and TR8 and TR9 denote reading-out switches. Reference symbols TR1 to TR9 denote MOS transistors. In addition, reference symbol $C_{TS}$ denotes an optical signal holding capacitor and $C_{TN}$ denotes a reset signal holding capacitor.

In the conventional circuit of FIG. 2, a reset signal (a noise component and a dark current component) is held in the reset signal holding capacitor $C_{TN}$ and an optical signal (an optical signal component, a noise component and a dark current component) is held in the optical signal holding capacitor $C_{TS}$ as described in detail later. Thereafter, signals held in the respective holding capacitors $C_{TN}$ and $C_{TS}$ are read out to detect a difference by a differential circuit (not shown), whereby an optical signal with the noise component removed is outputted. In an image pickup apparatus in which a plurality of such image pickup elements are tessellated together, "binding or seam" of moving images between image pickup elements is important when an image of a moving object is picked up.

FIG. 3 shows image composition in the case where the four image pickup elements are tessellated together. When the four image pickup elements are independently driven in a scanning direction as shown by arrows in FIG. 3, correlation of images at binding portions of four images (a connecting portion of image pickup areas A1 and B2, a connecting portion of the image pickup areas B1 and A2, a connecting portion of the image pickup areas A1 and B1 and a connecting portion of the image pickup areas B2 and A2) is eliminated. For example, temporal deviation for a scanning period in a column direction occurs between a column of the image pickup area A1 (a column where scanning ends) and a column of the image pickup area B2 (a column where scanning starts) that are adjacent with each other in the vicinity of the connecting portion of the image pickup areas A1 and B2, and thus correlation of images is lost. At this point, "binding" of moving images are concerned basically in portions of the image pickup areas A1 and B1, the image pickup areas A1 and B2, the image pickup areas B2 and A2 and the image pickup areas B1 and A2 where the images are connected. With a structure in which the image pickup elements using the amplification-type image pickup element such as the CMOS type image pickup element are tessellated together in this way, correlation of images is lost at bindings between the image pickup elements, resulting in decrease in image quality.

SUMMARY OF THE INVENTION

It is an object of the present invention to obtain an image with high quality.

In order to attain the above-mentioned object, according to one embodiment, there is provided an image pickup apparatus comprising an image pickup element having pixels arranged in a two-dimensional state, each pixel having a photoelectric conversion portion, a first holding portion for holding a photoelectric conversion signal generated in the photoelectric conversion portion and a second holding portion for holding a noise signal generated in the pixel.

Further, there is provided an image pickup apparatus comprising: a plurality of image pickup elements, each having pixels arranged in a two-dimensional state, wherein each of the image pickup elements divides and picks up an object image and each of the pixels has a photoelectric conversion portion and a holding portion for holding a signal generated in the photoelectric conversion portion; and a driving circuit for collectively transferring a signal generated in the photoelectric conversion portion included in each of the plurality of pixels included in the plurality of image pickup elements to the corresponding holding portion.

Further, there is provided an image pickup apparatus comprising: an image pickup element having pixels arranged in two-dimensional state, each having a photoelectric conversion portion, and a scanning circuit for resetting the photoelectric conversion portion; and a control circuit for continuously generating radiation to be irradiated on the image pickup element at a predetermined interval, wherein the control circuit performs control such that radiation is emitted after resetting for one screen in the image pickup element is finished.

Other features and effects of the present invention will become more apparent from the following detailed description with reference to the accompanying drawings.

DESCRIPTION OF THE PREFERRED EMBODIMENTS

Embodiments of the present invention will be hereinafter described with reference to the accompanying drawings. First, a structure common to first to fifth embodiments will be described.

Figure 4:
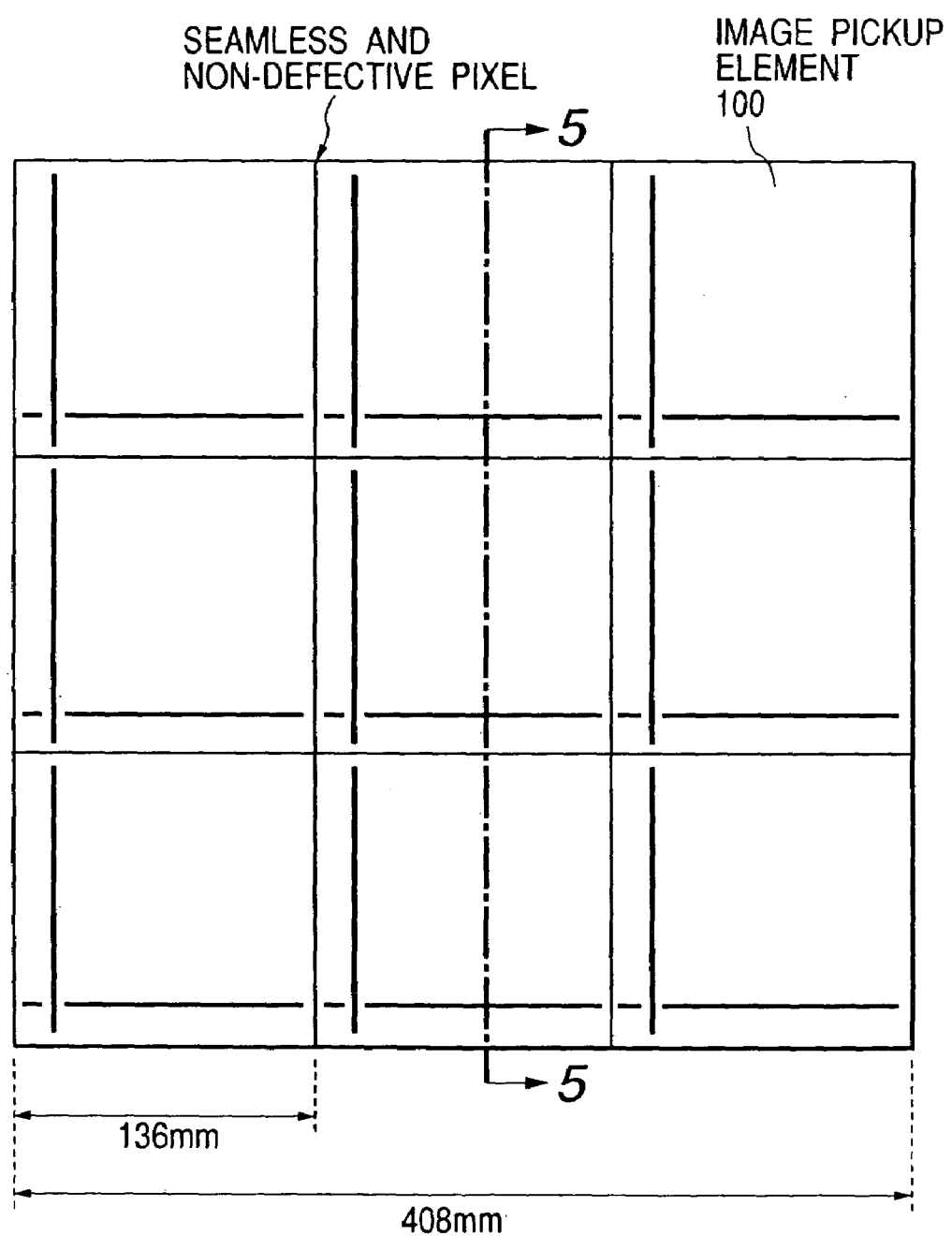
FIG. 4 is a view showing a layout of image pickup elements.

FIG. 4 shows an example in the case where nine image pickup elements of 136 mm×136 mm having pixels arranged in a two-dimensional state therein are tessellated together to constitute a large area radiation moving image pickup apparatus of 408 mm×408 mm. Nine image pickup elements 100 are tessellated together on a base to constitute an image pickup apparatus of a large screen as a whole.

Figure 5:
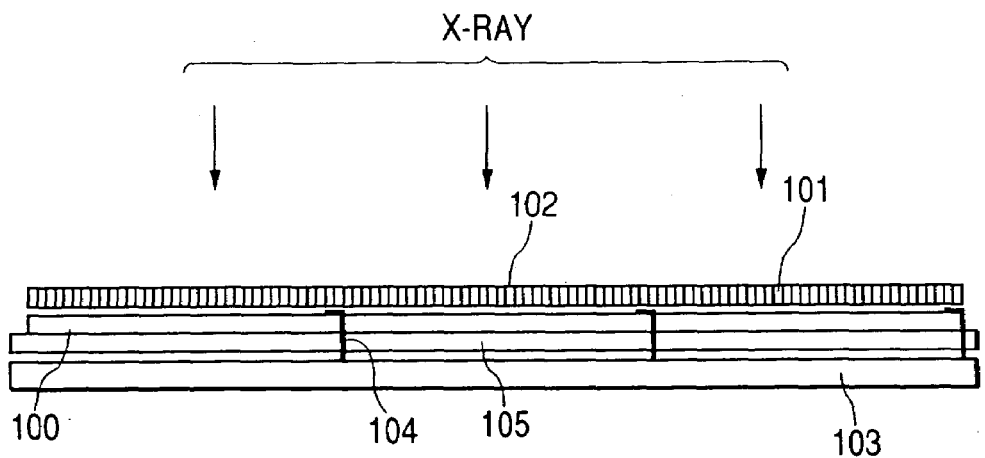
FIG. 5 is a sectional view taken along a line 5—5 in FIG. 4.

FIG. 5 shows a sectional view taken along a line 5—5 of FIG. 4. A scintillator 101 consists of $Gd_2O_2s$, CsI or the like that uses europium, terbium or the like as an activator and is disposed on an FOP (fiber optic plate) 102. The FOP 102 is nonmagnification optical transmitting means for guiding light generated by the scintillator 101 to the image pickup elements without magnification. In addition, the FOP 102 functions to absorb X-rays that is not absorbed by the scintillator 101 to protect the image pickup elements from X-ray damages.

X-rays are irradiated on the scintillator 101 to be converted to visible light, which is transmitted by the FOP 102 and detected by the image pickup elements. The scintillator 101 is preferably selected such that a wavelength of its emitted light matches sensitivity of the image pickup elements. An external processing substrate 103 is a substrate having a circuit for supplying a power source, clock and the like for the image pickup elements and taking out a signal from the image pickup elements to process it. A flexible substrate 104 is a wiring substrate for performing electric connection between each image pickup element and the external processing substrate by a TAB (tape automated bonding). Note that, although X-rays are used as radiation in this description, alpha rays, beta rays, gamma rays, or the like can be used as well.

The nine image pickup elements 100 are tessellated together on a base 105 such that no gap is substantially formed between the image pickup elements, which means that no void among the image pickup elements is formed in an image that is formed by the nine image pickup elements. Input of clock, a power source and the like of the image pickup elements and output of a signal from the image pickup elements are performed between the image pickup elements and the external processing substrate 103 disposed on a back side of the image pickup elements through the flexible substrate 104 connected to electrode pads at end portions of the image pickup elements. A thickness of the TAB flexible substrate 104 is small enough with respect to its size not to cause a defect on an image even if it is passed through the gaps among the image pickup elements.

Figure 6:
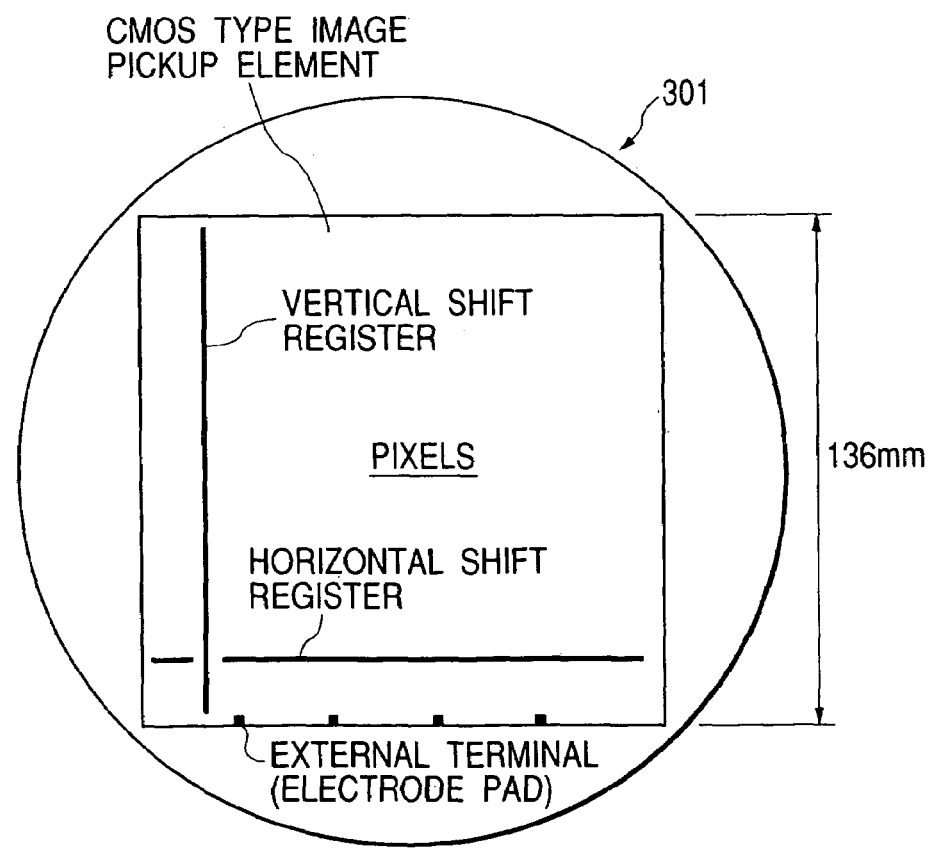
FIG. 6 is a view showing an example in the case where one image pickup element is manufactured from one piece of wafer.

FIG. 6 shows an example in the case where one image pickup element is manufactured from an eight-inch wafer 301 that is mainly used at present. A CMOS type image pickup element substrate of 136 mm×136 mm is manufactured with a one-piece take-out method by a CMOS process. A size of a pixel in an X-ray image pickup apparatus for medial use may be as large as 100 μm×100 μm to 200 μm×200 μm. In this structure, a pixel size is assumed to be 160 μm×160 μm. In addition, as shown in FIG. 6, a vertical shift register and a horizontal shift register are formed in the image pickup element and external terminals (electrode pads) are provided at an end portion of the element in the vicinity of the horizontal shift register. These electrode pads are used for connection with the flexible substrate as described above.

Figure 7:
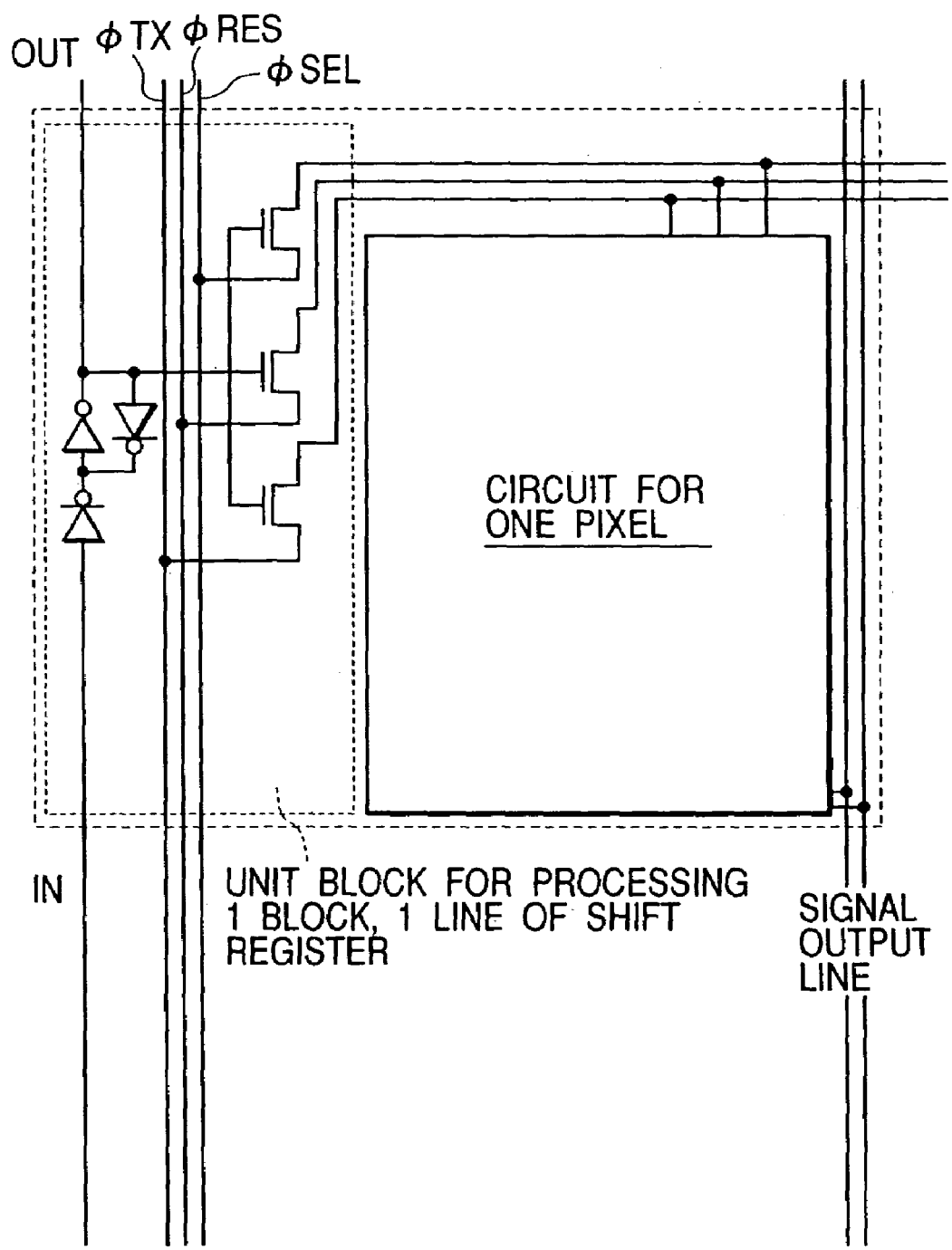
FIG. 7 is a view showing a state in which a unit block of a vertical shift register is disposed in one area (cell) together with one pixel circuit.

FIG. 7 shows a state in which a unit block (unit for selecting and driving one column) of the vertical shift register is disposed in one area (one cell) together with one pixel circuit. The pixel circuit will be described later. Since FIG. 7 is a schematic view, areas of the unit block and the pixel circuit do not reflect an actual element layout. The vertical shift register shows a simple circuit constituted of a static shift register and a transfer gate in order to create a transfer signal ΦTX, a rest signal ΦRES and a selection signal ΦSEL. These are driven by a signal from a clock signal line (not shown). A circuit structure of the shift register is not limited to this and can be any structure according to various driving methods such as addition, curtailed read-out and the like. However, it is assumed that a function block is disposed in one cell together with a pixel circuit and shift registers are provided in effective areas to realize an image pickup element having an effective area over its entire surface as in this embodiment.

In addition, an n versus $2^n$ decoder can be used as a scanning circuit instead of a shift register. In this case, an output of a sequentially incrementing counter is connected to an input of the decoder, whereby it becomes possible to sequentially perform scanning in the same manner as the shift register. On the other hand, an address of an area from which an image is desired to be obtained is inputted in the input of the decoder, whereby an image of an arbitrary area by random scanning can be obtained. A common processing circuit disposed in each area (cell) in an effective area means a circuit for commonly processing plural portions such as a final signal output amplifier, a serial/parallel converting multiplexer, a buffer and various gate circuits collectively.

Figure 8:
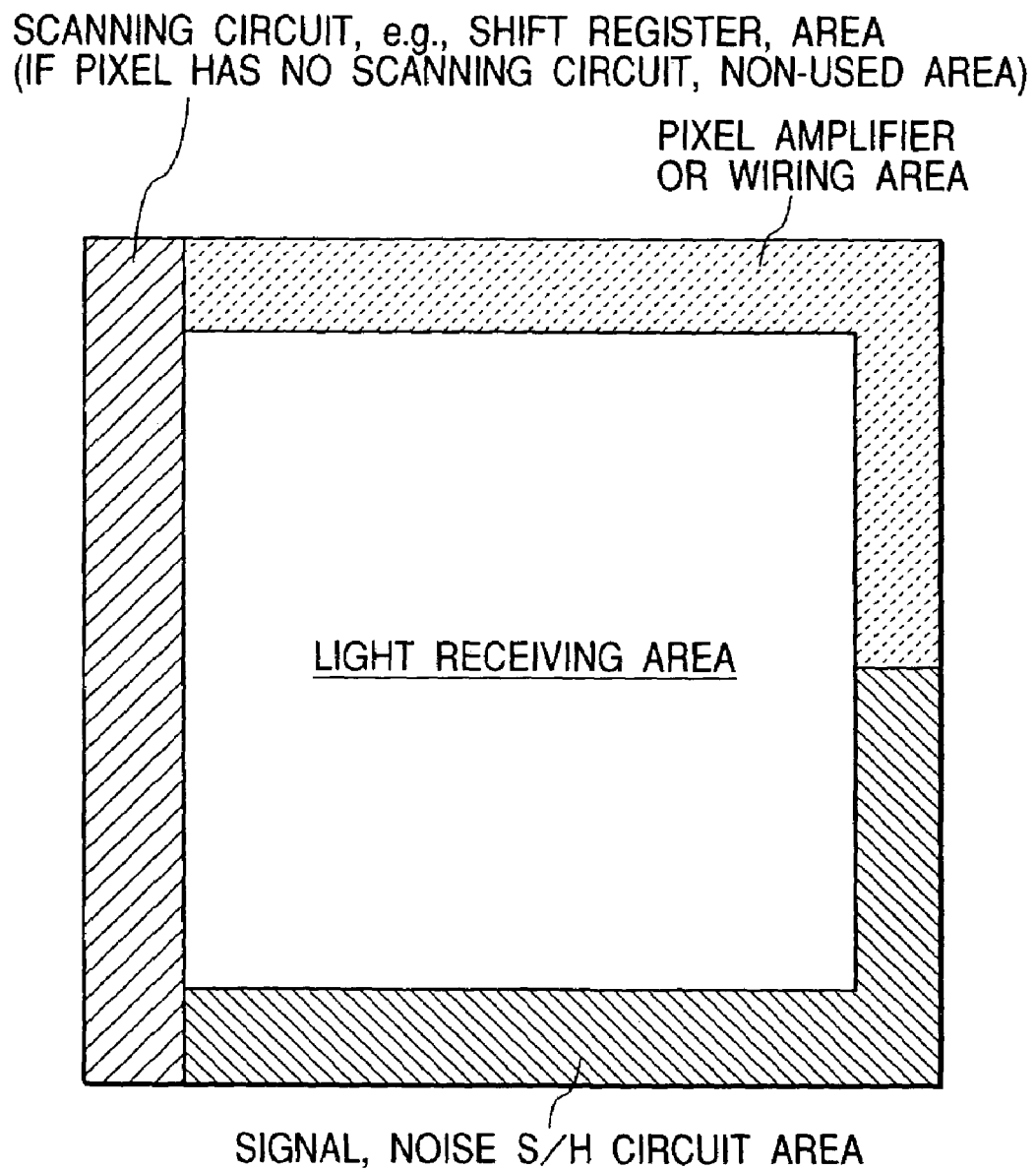
FIG. 8 is a view showing a layout of one area (cell) including a shift register.

FIG. 8 shows a layout of one area (one cell) in which a shift register is disposed. A light receiving area is disposed in the center and a scanning circuit, e.g., shift register, area, a pixel amplifier, wiring area, and a signal, and noise S/H circuit area are disposed around it.

In addition, the following assumptions are made.
Cell size: 160 μm×160 μm
S/H circuit area: 15 μm×320 μm
Light receiving area of a pixel: 130 μm×130 μm
Pixel amplifier or wiring area: 15 μm×320 μm
Shift register block: 15 μm×160 μm
Thus, an opening ratio is 66%.

A layout of one area in which the shift registers are not disposed is the layout shown in FIG. 8 with a shift register block deleted. At least a light receiving area in one area in which the shift registers are not disposed is identical with a light receiving area of one area (cell) in which the shift registers are disposed.

Figure 9:
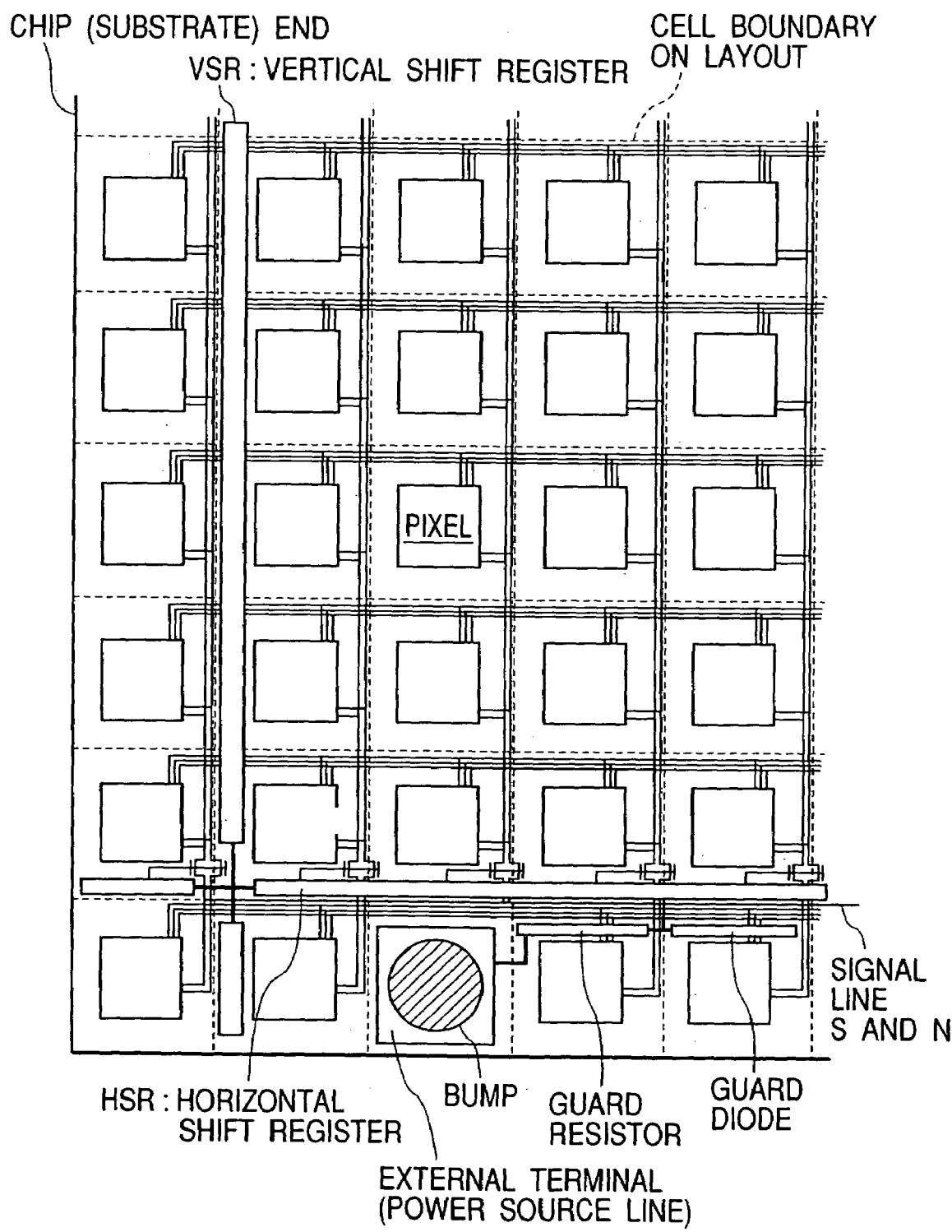
FIG. 9 is a view showing a state in which pixels are arranged.

FIG. 9 shows a structure (plan view) of the image pickup element of this embodiment. In this embodiment, the vertical shift register and the horizontal shift register are disposed in an effective area of the image pickup element and a plurality of pixels are arranged two-dimensionally in the vertical and horizontal directions in the image pickup element. In addition, one block of the shift registers for processing one line is disposed to be contained in one pitch. A plurality of such blocks are arranged to form a set of vertical shift register blocks and horizontal shift register blocks. These blocks extend linearly in the vertical and the horizontal directions.

Moreover, it is assumed that at least light receiving areas have an equal area in all the pixels. In FIG. 9, an area of one pixel circuit and an area of a light receiving area in the one pixel circuit are equal among different cells. In addition, although it is preferable to make an area of a light receiving area equal among all the cells, it is possible that an area of a light receiving area in a cell in one line at an end portion of the image pickup element is different from an area of a light receiving area in a cell in the inner part of the image pickup element in order to take a margin for slice. Further, in FIG. 9, a bump is provided on an external terminal and a guard resistor and a guard diode for guarding an inside circuit from static electricity are connected to this bump.

In this embodiment, a light receiving area is made in an equal size and the centers of gravity of the light receiving areas are arranged at an equal pitch in each image pickup element and among image pickup elements, whereby dispersion of sensitivity and dispersion of the center of gravity of a light receiving area do not occur in each image pickup element and among image pickup elements even when the shift resistors and the like are disposed in the effective area. Thus, it is possible to obtain an image that is substantially seamless even in a structure in which image pickup elements are tessellated. In addition, since a dead space is not generated in the periphery of the image pickup element, the entire surface of the image pickup element becomes an effective area.

By arranging these image pickup elements just like arranging tiles such that there is substantially no gap, a large area image pickup apparatus can be formed. Moreover, with the above-mentioned circuit structure, a large area image that is substantially seamless in terms of time and space can be obtained. Here, in the X-ray image pickup apparatus for medical use, a size of a pixel may be as large as 100 μm×100 μm to 200 μm×200 μm. Thus, there arises no problem at all even if shift registers are disposed in an effective pixel area or even if a circuit like a sample hold is disposed in an pixel because a sufficiently large opening ratio can be realized.

In addition, in this embodiment, although X-rays transmitted through the scintillator are directly irradiated on the shift registers because the shift registers are disposed in the effective area, static shift registers are used as the shift registers to avoid being affected by the X-rays. The shift register circuit is used for sequentially transferring pulse signals. That is, since the static shift register is relatively unlikely to be affected by X-rays in principle, it can be used in a position on which X-rays are directly irradiated as in this embodiment. Therefore, if the static shift register is used, an image pickup apparatus with few X-ray damages and errors and improved reliability can be realized.

Moreover, since the CMOS type image pickup element is used as the image pickup element in this embodiment, power consumption is low. Thus, it is preferable in manufacturing a large area image pickup apparatus. Note that it is for the purpose of making operations in the image pickup element fast to incorporate the multiplexer in the image pickup element. In addition, a signal is taken out to the outside from the image pickup element via an electrode pad and there is a large floating capacitance around this electrode pad. Therefore, a transmission characteristic of a signal can be compensated for by providing an amplifier in the pre-stage of the electrode pad.

Although the FOP is used for the nonmagnification optical transmitting means in this embodiment, a nonmagnification lens optical system such as a SELFOC lens may be used. The lens optical system has an advantage that manufacturing costs of the image pickup apparatus can be significantly reduced, although an efficiency for light utilization falls in comparison with the FOP. Further, if the influence of X-ray can be neglected, e.g., in case of using X-ray of low energy, the scintillator plate may be directly adhered to the image pickup element with adhesives.

<First Embodiment>

Figure 10:
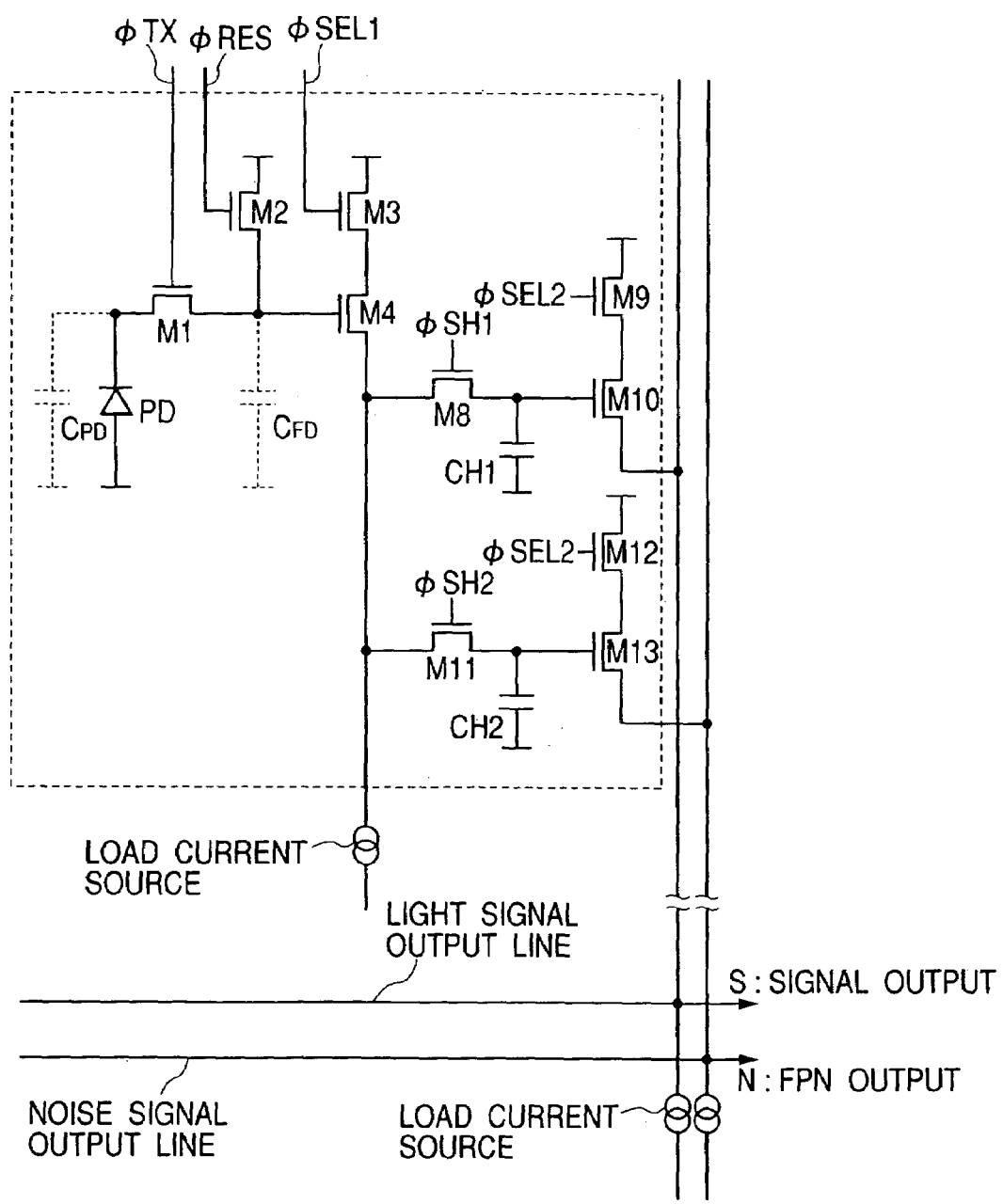
FIG. 10 is a circuit diagram showing a pixel circuit of a first embodiment of an image pickup apparatus according to the present invention.

FIG. 10 is a circuit diagram showing a first embodiment of an image pickup apparatus according to the present invention. FIG. 10 is a circuit diagram of one pixel. In this embodiment, image pickup elements are tessellated together to realize a moving image that is seamless in terms of time and space, high-speed and highly sensitive. In addition, CMOS type image pickup elements are used to read out accumulated electric charges from all the elements at common time with a high signal-noise ratio (S/N). Note that the image pickup element in this specification means an image pickup element panel on which a plurality of pixels are arranged two-dimensionally. The entire surface of this image pickup element panel is a pixel area. By tessellating together a plurality of image pickup element panels on a base, a large area image pickup apparatus is realized (see FIG. 4).

In FIG. 10, reference symbol PD denotes a photodiode for performing photoelectric conversion, $C_{pp}$ denotes a joining capacitor (shown by broken lines) of the photodiode PD, $C_{FD}$ denotes a capacitor (shown by broken lines) of a floating diffusion for accumulating electric charges (floating diffusion area), M1 denotes a transfer MOS transistor (transfer switch) for transferring electric charges generated by the photodiode PD to the floating diffusion $C_{FD}$, M2 denotes a reset MOS transistor (reset switch) for discharging electric charges accumulated in the floating diffusion $C_{FD}$, M3 denotes a selection MOS transistor (selection switch) for selecting a photoelectric conversion portion and M4 denotes an amplification MOS transistor (pixel amplifier 1) functioning as a source follower.

In addition, reference symbol M8 denotes a MOS transistor as a sample switch constituting a sample hold circuit for accumulating optical signals that is a characteristic of this embodiment and CH1 denotes a holding capacitor for optical signals. Reference symbol M11 denotes a MOS transistor as a sample switch constituting a sample hold circuit for accumulating noise signals and CH2 denotes a holding capacitor for noise signals. Reference symbol M10 denotes an amplification transistor (pixel amplifier 2) as a source follower for amplifying an output from the sample hold circuit for optical signals to output it to a signal line. Reference symbol M13 is an amplification transistor (pixel amplifier 3) as a source follower for amplifying an output from the sample hold circuit for noise signals to output it to a signal line. Moreover, reference symbols M9 and M12 are MOS transistors as selection switches of the pixel amplifiers 2 and 3.

In this embodiment, these optical signals and the sample hold circuit for noise signals are used in order to collectively reset and collectively expose each image pickup element at the same timing. In addition, since an image signal can be saved in a part of this sample hold circuit independently of exposure, an optical signal and a noise signal can be read out nondestructively any number of times during an exposure period. Reading-out of a signal for automatic exposure can be performed using this function while performing exposure.

Next, a noise will be described. In general, with the amplification-type image pickup element such as the CMOS type image pickup element, a signal gain is increased by providing amplifying means inside it (intra-pixel amplifier) in order to improve a signal-noise ratio (S/N) at the reading-out time. With a source follower of an MOS transistor that is generally used as the amplifying means, a threshold value Vth of the MOS transistor tends to disperse. This dispersion is peculiar to design and manufacture of an element and is harmful in that it changes for each pixel and for each element. In particular, since an image pickup element for an X-ray image pickup apparatus is large, dispersion in the element tends to be large. In addition, if a plurality of image pickup elements are used, dispersion among the elements is also large. This dispersion appears as fixed dispersion of an output, a so-called fixed pattern noise (FPN), and a nonuniform background image.

In addition, a 1/f noise (flicker noise) or a thermal noise tends to be generated in the MOS transistor. Since this is a random noise, a random background image is generated. Given that a channel length of the MOS transistor is L and a channel width is W in terms of device design, since the thermal noise is proportional to $(L/W) \cdot \frac{1}{2}$ and the 1/f noise is inversely proportional to L·W, it is sufficient to set the channel length t minimum and the channel width W large in order to minimize a noise of the MOS transistor. However, in particular, if the channel width W of a source follower as an amplifier that becomes a large noise source is set large, a parasitic capacitance between a gate and a drain increases to reduce a gain and cause decrease of sensitivity. Therefore, this is difficult to be implemented.

In this embodiment, a PMOS transistor essentially having a small 1/f noise is used at least as the source follower. Consequently, a size of the source follower can be reduced to one tenth of an NMOS transistor. In addition, the PMOS transistor is more preferable because, even if X-rays transmitted through the scintillator is directly irradiated on the transistor, it has a stronger X-ray resistance compared with the NMOS transistor (a leak current increase and variation of a threshold value Vth are small).

Figure 1:
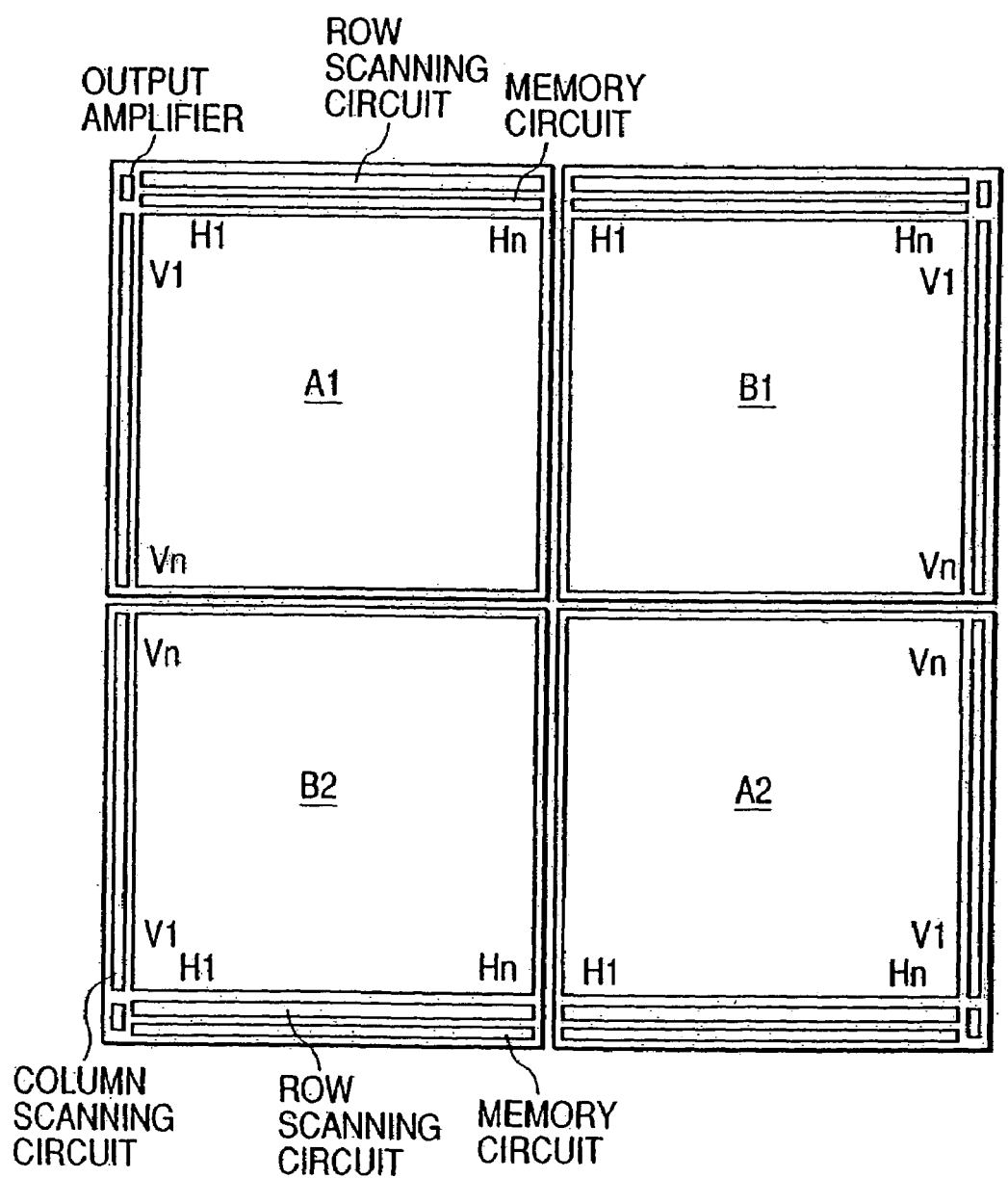
FIG. 1 is a plan view showing an image pickup apparatus of a conventional example.
Figure 2:
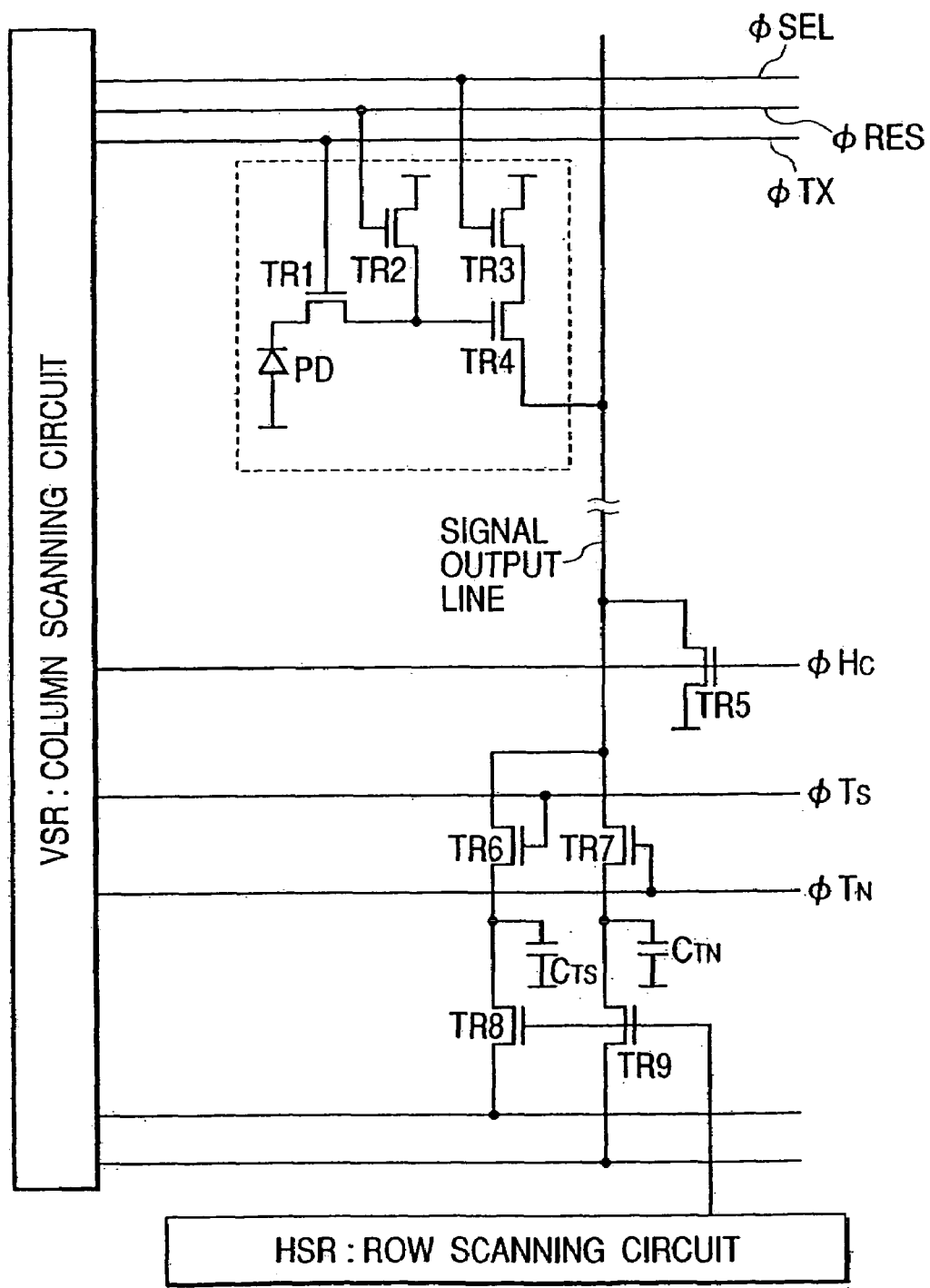
FIG. 2 is a circuit diagram showing a pixel circuit of the image pickup apparatus of the conventional example.
Figure 3:
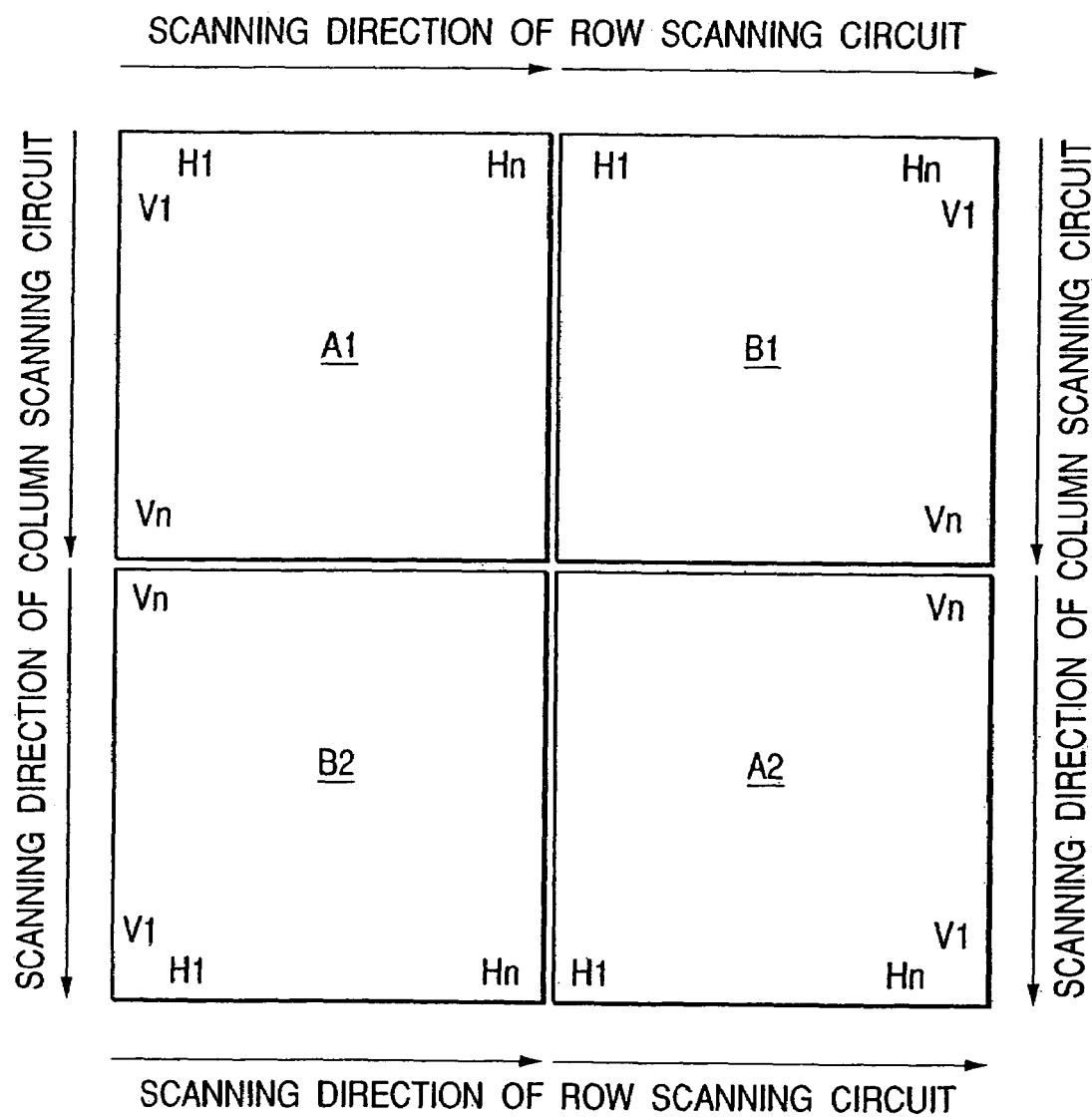
FIG. 3 is a view for describing image composition of the image pickup apparatus of FIG. 1.

In general, it is publicly known that a dual sampling circuit is used in order to reduce a low-frequency noise component such as a 1/f noise and a fixed pattern noise (FPN) due to dispersion of a threshold value and a noise from a power source. FIG. 2 shows the dual sampling circuit in the conventional one pixel circuit and signal reading-out circuit as described above.

In this circuit, the reset switch TR2 is closed by the reset signal ΦRES first and, then, the photodiode PD is reset. Next, the column selection MOS transistor TR3 is closed, and a dark signal passes through the amplification MOS transistor TR4 to appear in an output line. At this point, after holding the reset signal (a noise component and a dark current component) in the reset signal holding capacitor $C_{TN}$ by closing the sample switch TR6, the sample switch TR6 is opened. Subsequently, the reset switch TR2 is opened and the transfer MOS transistor TR1 is opened to transfer optical signal charges accumulated in the photodiode PD to the amplification MOS transistor TR4. At the same time, the column selection MOS transistor TR3 is closed, and an optical signal passes through the amplification MOS transistor TR4 to appear in the output signal line. At this point, after holding the optical signal (an optical signal component, a noise component and a dark current component) in the optical signal holding capacitor $C_{TS}$ by closing the sample switch TR7, the sample switch TR7 is opened.

Subsequently, the reading-out switches TR8 and TR9 are simultaneously opened to read out the reset signal held in the reset signal holding capacitor $C_{TN}$ and the optical signal held in the optical signal holding capacitor $C_{TS}$ to a differential circuit (not shown) and subtract the reset signal from the optical signal, whereby an optical signal with a noise removed is outputted. Next, in order to perform reading-out from all the columns, each row line is selectively sampled, and thereafter, the next column is selected and the same operations are repeated.

Here, the thermal noise (kTC noise) in the photoelectric conversion portion is not generated if the full depletion transfer is performed by the pixel switch. In addition, the reset noise (kTC noise) in the floating diffusion is removed by this correlating dual sampling circuit together with the 1/f noise and the FPN due to dispersion of the threshold value Vth. However, since two source followers and capacitors for the correlating dual sampling circuit for each row are conceptually identical but are not completely identical, dispersion of the threshold value Vth and capacitance and the like are generated to cause a line-like fixed pattern in an output differential signal (for each row).

In addition, since the threshold value Vth exponentially changes according to temperature, each source follower appears as variation of an output in conformity with a temperature difference of 1° C. or less. Thus, if photographing is performed with a low exposing radiation amount as in fluoroscopy, this slight variation affects an image quality. Thus, the two source followers of the sample hold circuit must be disposed and structured such that dispersion of the threshold value Vth is as small as possible in terms of a layout as discussed below and has a mechanism for not causing a temperature difference during operation. If timing for reading out of the optical signal and the noise signal from the sample hold circuit is different as in the conventional example, temperature variation is caused by this time difference.

Thus, in this embodiment, the sample hold circuits for optical signals and noise signals are provided in the pixel as described above and are structured such that the optical signal and the noise signal are saved independently of exposure and, at the same time, outputted from the sample hold circuits together (two line output for each row). It is necessary to provide a memory in the pixel for collective exposure, and this sample hold circuits function as an intra-pixel memory first. Moreover, a function for removing a noise is given to the sample hold circuits. Since the optical signal and the noise signal are taken in the sample hold circuits from the pixel amplifier 1 at a very small time difference, 1/f noise which becomes large at low-frequency can be neglected.

In addition, the thermal noise, the 1/f noise and the FPN in the pixel amplifier are removed utilizing these circuits. Dispersion of elements of the two sample hold circuits is reduced as much as possible by disposing capacitors as close as possible in the pixel, disposing the output source followers in a crossing manner as in an ordinary MOS circuit layout and contriving to reduce dispersion of the threshold value Vth as much as possible. In this way, these sample hold circuits function as accumulating means for each pixel for collective exposure and also function as means for removing a noise.

Figure 11:
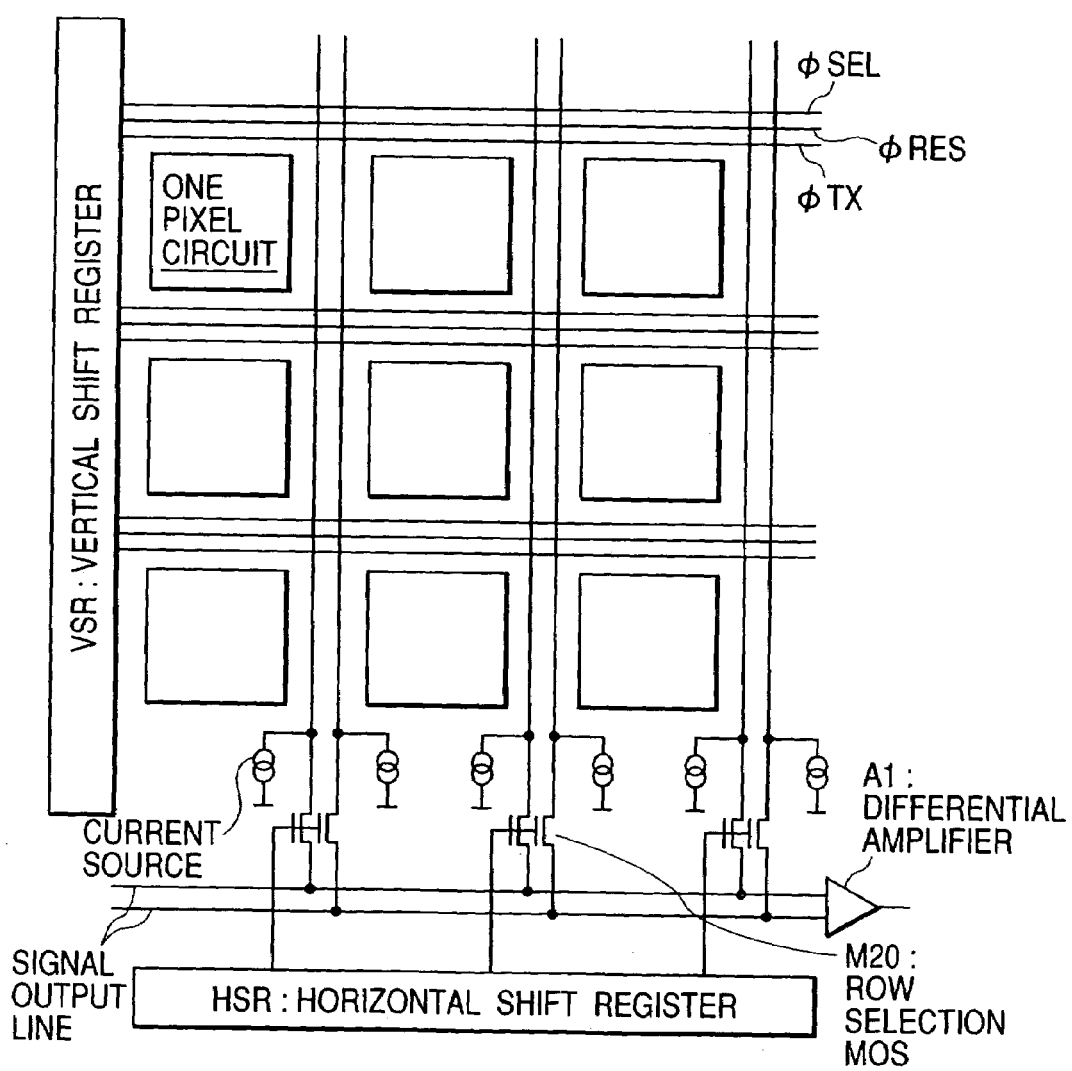
FIG. 11 is a view showing the entire circuit of the image pickup element of the embodiment of FIG. 10.

FIG. 11 shows a schematic view of the entire circuit in the case of 3×3 pixels for simplicity. Details of the one pixel circuit portion are as shown in FIG. 10. The gate of the transfer switch M1 is connected to ΦTX from a vertical shift register VSR that is a kind of a vertical scanning circuit and the gate of the reset switch M2 is connected to ΦRES from the vertical scanning circuit. In addition, the gate of the selection switch M3 is connected to ΦSEL from the vertical scanning circuit. For simplicity, only these three are shown as control lines. An optical signal and a noise signal from each pixel are outputted to the differential amplifier A1 via a row scanning circuit (a horizontal shift register and a multiplexer) by two signal output lines. A row selection MOS transistor M20 is a switch that is actuated by a signal from the horizontal shift register HSR to select a signal line in the row direction.

Figure 12:
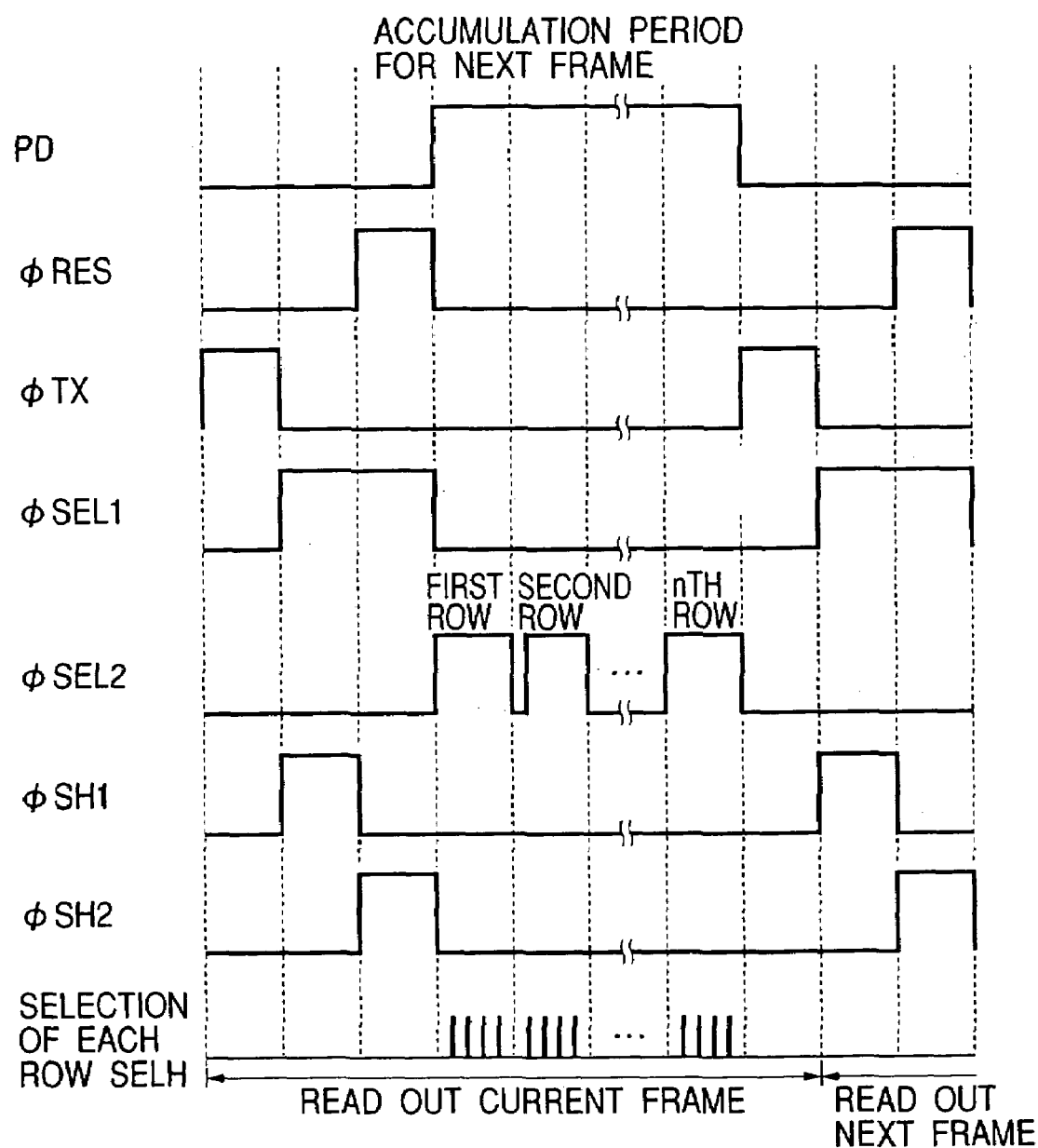
FIG. 12 is a timing chart for describing operations of the pixel circuit according to the embodiment of FIG. 10.

FIG. 12 is a timing chart for showing operation timing of the pixel portion in this embodiment. Circuit operations will be hereinafter described based on FIG. 12. First, photoelectric conversion is performed by the photodiode PD. In addition, the exposure is collective exposure and is performed on all the pixels in each image pickup element at identical timing and in an identical period. Thus, temporal deviation of images among image pickup elements and among scanning lines does not occur at all. The transfer switch M1 is in an off state during an accumulation period of photocharges and generated photocharges are accumulated in the joining capacitor $C_{PD}$. During this period, the photocharges are not transferred to the floating diffusion $C_{FD}$ that is formed in the gate portion of the source follower constituting the pixel amplifier 1 (M4).

When the accumulation in the photodiode PD ends, as indicated in FIG. 12, the signal ΦTX from the vertical shift register VSR is changed to high level collectively for all the pixels. The transfer switch M1 is turned on to completely transfer the electric charges accumulated in the photodiode PD to the floating diffusion $C_{FD}$ formed on the gate portion of the source follower M4 constituting the pixel amplifier 1. Thereafter, the signal ΦTX is changed to low level collectively for all the pixels. Then, the transfer switch M1 is turned off to change a signal ΦSEL1 from the vertical shift register VSR to high level collectively for all the pixels as indicated in FIG. 12. Consequently, the selection switch M3 is turned on to bring the source follower circuit constituted of the load current source and the pixel amplifier 1 to an operation state.

At the same time, as indicated in FIG. 12, a signal ΦSH1 from the vertical shift register VSR is changed to high level. Then, the sample switch M8 is turned on to collectively transfer signals from the photodiode PD to the capacitor CH1 through the pixel amplifier 1 (M4). At the same time, as indicated in FIG. 12, the signal ΦTX is changed to low level collectively for all the pixels, whereby the photodiode PD is brought to a state in which exposure of the next frame is possible. At the same time, as indicated in FIG. 12, the signal ΦSH1 is changed to low level collectively for all the pixels. Then, the sample switch M8 is turned off to end a holding operation of optical signal charges to the sample hold circuit.

Next, as indicated in FIG. 12, the signal ΦRES from the vertical shift register VSR is changed to high level collectively for all the pixels. Then, the reset switch M2 is turned on to reset the floating diffusion $C_{FD}$. Without a moment's delay, as indicated in FIG. 12, the signal ΦSH2 from the vertical shift register VSR is changed to high level collectively for all the pixels. Then, the sample switch M11 is turned on to transfer the reset signal to the capacitor CH2. Subsequently, the signal ΦSH2 is changed to low level collectively for all the pixels and the sample switch M11 is turned off to end transfer of the optical signal and the noise signal to and holding of them in the sample hold circuit.

In addition, as indicated in FIG. 12, a signal ΦSEL2 is changed to high level for each column by a signal inputted in the vertical shift register VSR. Then the selection switches M9 and M12 are turned on to bring the source follower circuit constituted of the load current source and the pixel amplifiers 2 and 3 (M10 and M13) to an operation state. Consequently, the optical signal and the noise signal held in the holding capacitors CH1 and CH2 are transferred to a noise signal output line and an optical signal output line through the pixel amplifiers 2 and 3. The signals transferred to the noise signal output line and the optical signal output line are subject to subtraction processing of (signal—noise) in a subtraction output amplifier (not shown) connected to the noise signal output line and the optical signal output line, and a signal with the thermal noise, the 1/f noise and the FPN removed is outputted. Further, the subtraction output amplifier corresponds to the differential amplifier of FIG. 2.

In the above operations, since the electric charges from the photodiode PD are completely transferred to the floating diffusion $C_{FD}$, a kTC noise is not generated. However, if the size of a pixel is as large as 160 μm×160 μm, the complete transfer becomes difficult. In this case, a kTC noise is generated and outputted as a random noise because a rest noise (kTC noise) in the floating diffusion contained in the optical signal and the noise signal is not correlated in the above-mentioned reading-out. However, at the time of photographing a moving image, since a fixed pattern noise affects an image quality more than a random noise, a sufficiently high image quality is obtained even if the complete transfer is difficult in this embodiment. An example of further removing a reset noise will be described later.

In this way, the above-mentioned series of operations are repeated. The signal ΦSEL2 is changed to high level for each column and a signal SELH (not shown) is changed to high level for each row in the accumulation period, whereby a noise signal and an optical signal in a prior frame are outputted. The noise signal is subtracted from the optical signal by a not-shown subtraction amplifier, whereby the thermal noise, the 1/f noise, the fixed pattern noise (FPN) due to the temperature difference and dispersion of the process can be removed.

As described above, the collective exposure is performed after the photodiodes PD are collectively reset and optical signals and noise signals are accumulated in the sample hold circuits in the pixels, whereby exposure of the next frame and reading-out of these signals can be performed independently. Consequently, since it is possible to perform exposure while performing high-speed reading-out, even in multi-pixel driving and high-speed operation under a low exposuring radiation amount as in a large area X-ray image pickup apparatus, it is possible to take accumulation time as long as possible, make an optical signal intensity large, further perform noise reduction and improve the signal-noise ratio (S/N).

Moreover, since a plurality of image pickup elements can be driven by a common driving pulse, a driving pulse generating circuit in their vicinity is simplified. In addition, it can be seen that, since the image pickup elements are commonly driven, an image pickup element driving circuit can be shared by the image pickup elements, which is excellent in terms of installation.

Figure 13:
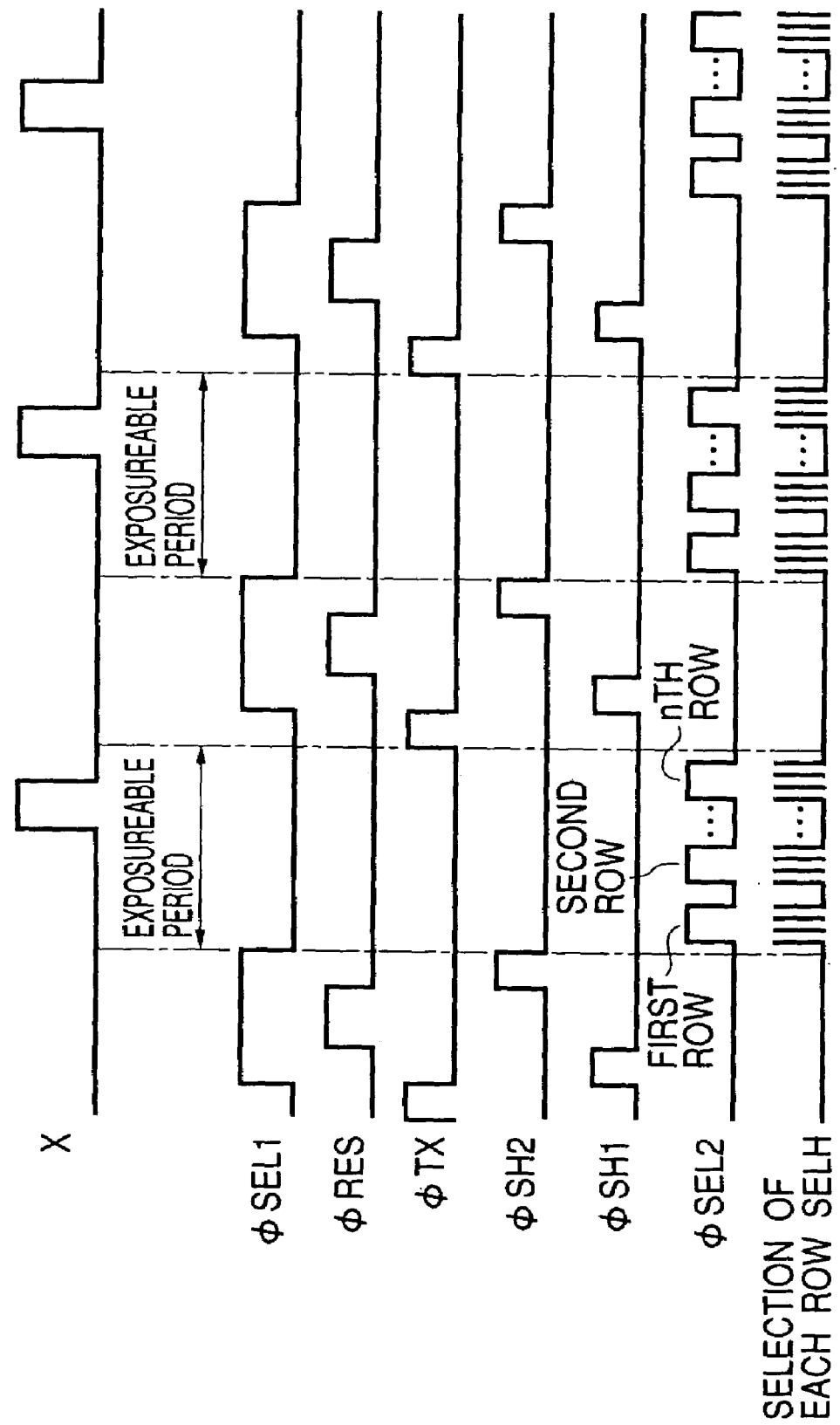
FIG. 13 is a timing chart for describing operations of the pixel circuit according to the embodiment of FIG. 10.

Although the structure for always outputting X-rays in a moving image photographing is described above, it is also possible to perform photographing by pulse-irradiating X-rays. That is, as shown in FIG. 13, X-rays are irradiated during an exposable period.

<Second Embodiment>

Figure 14:
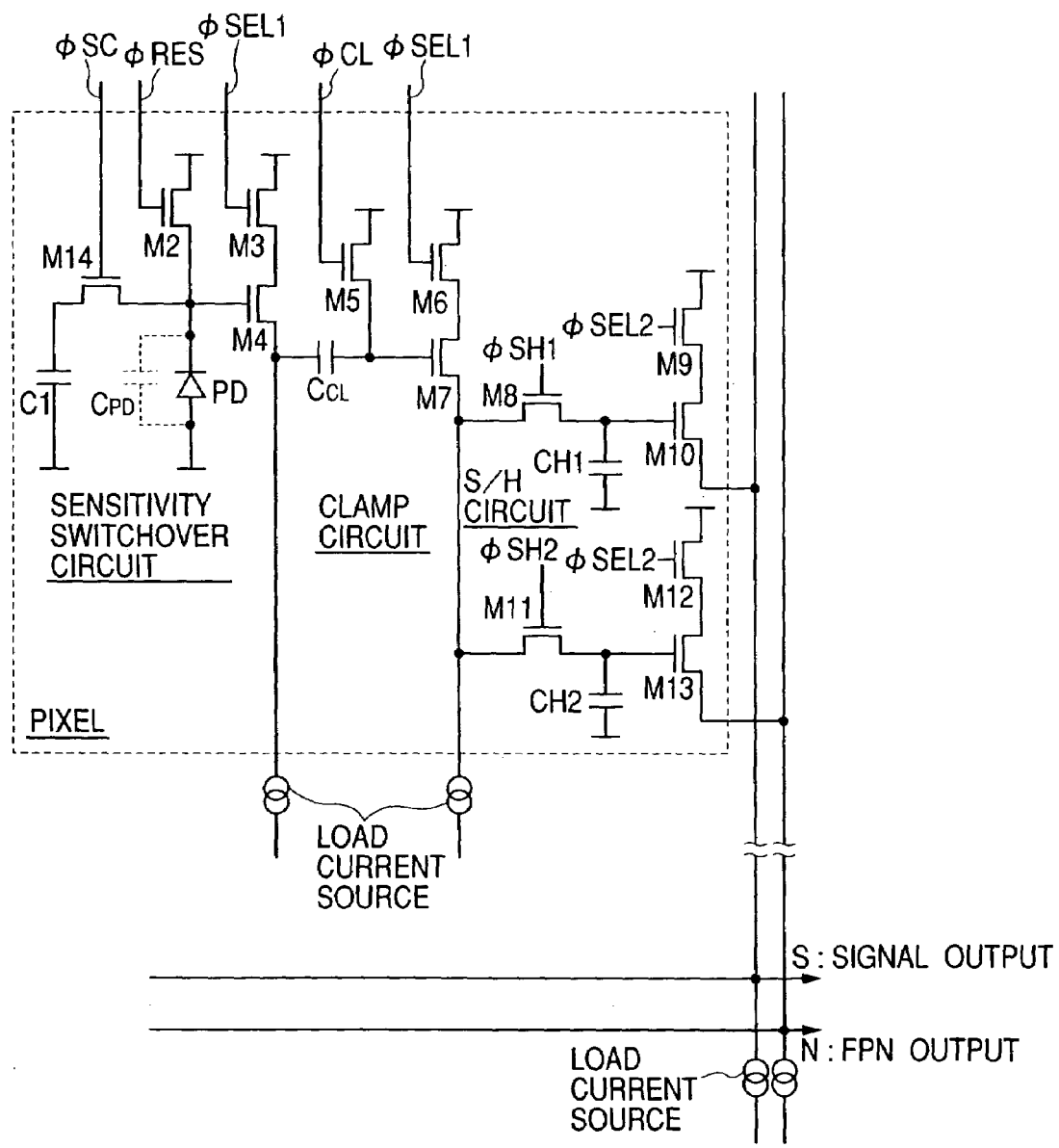
FIG. 14 is a circuit diagram showing a pixel circuit of a second embodiment of the image pickup apparatus according to the present invention.

Next, a second embodiment of the present invention will be described. A basic structure of an image pickup apparatus of the second embodiment is the same as that of the first embodiment except that a circuit structure of one pixel is different. FIG. 14 shows a pixel circuit of the second embodiment of the present invention. In this embodiment, kTC correction in a photoelectric conversion portion is performed in a pixel and a sensitivity switchover means is also provided a pixel, whereby still image photographing and high-speed moving image photographing are realized by mode switching.

Here, a peculiar condition required of a photoelectric conversion portion in an X-ray image pickup element that is used for both the still image photographing and the moving image photographing will be described. An amount of irradiated X-rays in photographing a moving image is approximately 1/100 of that in photographing a still image and is at most an amount of a few X-ray photons per one pixel (what is actually incident on a pixel is visible light to which this X-ray is converted). Thus, maximum sensitivity is required as an image pickup element. However, there is no problem in a dynamic range. Moreover, 60 to 90 frames/second is required as a reading speed. Resolution of a pixel may be rough at 200 μm×200 μm to 400 μm×400 μm. On the other hand, a dynamic range close to 80 dB is required in photographing a still image. As resolution of a pixel, 100 μm×100 μm to 200 μm×200 μm is required. An image pickup element that satisfies these specifications simultaneously has never existed to date.

Thus, in this embodiment, an image pickup element satisfying these specifications is realized by employing the pixel circuit structure as shown in FIG. 14 in the CMOS type image pickup element. In FIG. 14, reference symbol PD denotes an embedded photodiode that is the same as one used in a CCD and the like as a photoelectric conversion portion. The embedded photodiode controls a dark current generated on a surface of $SiO_2$ by providing a $p^+$ layer having a high impurity concentration on its surface. In addition, a capacitor $C_{PD}$ of the photodiode PD is designed to have a minimum capacitance such that maximum sensitivity is obtained at moving image photographing. As described later, when the capacitance of the photodiode PD is made small, a dynamic range is reduced. Since the dynamic range is insufficient in photographing a still image when an irradiated X-ray amount is one hundred times as large as that in the case of the moving image photographing or more, a capacitor C1 for enlarging the dynamic range is provided in parallel with the photodiode PD.

Reference symbol M14 denotes a changeover switch for switching a still image mode (high dynamic range) and a moving image mode (high sensitivity mode). A floating diffusion capacitor $C_{FD}$ (not shown) for accumulating electric charges is designed to have a minimum capacitance such that maximum sensitivity is obtained in photographing a moving image. The floating diffusion is connected to a gate portion of an amplification MOS transistor M4. Reference symbol M2 denotes a reset MOS transistor (reset switch) for discharging electric charges accumulated in the floating diffusion, M3 denotes a selection MOS transistor (selection switch) for selecting the pixel amplifier 1 and M4 denotes an amplification MOS transistor (pixel amplifier 1) functioning as a source follower.

A clamp circuit that is a characteristic of this embodiment is provided in a later stage of this pixel amplifier 1. A kTC noise generated in the optical conversion portion is removed by this clamp circuit. Reference symbol $C_{CL}$ denotes a clamp capacitor and M5 denotes a clamp switch. A sample hold circuit is provided in a later stage of the clamp circuit as in the first embodiment. Reference symbol M6 denotes a selection MOS transistor (selection switch) for selecting a pixel amplifier 2 and M7 denotes an amplification MOS transistor (pixel amplifier 2) functioning as a source follower. Reference symbol M8 denotes a sample MOS transistor switch constituting a sample hold circuit for accumulating optical signals and CH1 denotes a holding capacitor.

In addition, reference symbol M9 denotes a selection MOS transistor (selection switch) for selecting a pixel amplifier 3 and M10 denotes an amplifier MOS transistor (pixel amplifier 3) functioning as a source follower. Reference symbol M11 denotes a sample MOS transistor switch constituting a sample hold circuit for accumulating noise signals and CH2 denotes a holding capacitor. Reference symbol M12 denotes a selection MOS transistor (selection switch) for selecting the pixel amplifier 3 and M13 denotes an amplification MOS transistor (pixel amplifier 3) functioning as a source follower.

In this embodiment, since image pickup elements are collectively reset and collectively exposed at the same timing as in the first embodiment, these intra-pixel sample hold circuits for optical signals and noise signals are used. In addition, since an image signal can be saved in this part independently of exposure, an optical signal and a noise signal can be read out nondestructively any number of times during an exposure period. Reading-out of a signal for automatic exposure can be performed using this function while performing exposure.

Next, a structure of a pixel portion will be described. In a conventional pixel portion, signal charges generated in a photodiode are transferred to a floating diffusion by a transfer switch and electric charges accumulated in the floating diffusion are subject to electric charge/voltage conversion and outputted as a voltage by an amplification MOS transistor (pixel amplifier) functioning as a source follower. In the case of a small area photodiode, signal charges can be completely transferred to a floating diffusion by, for example, applying a sufficiently large voltage to a gate of a transfer transistor and a photodiode can be fully depleted. In this case, a kTC noise is not generated due to the complete transfer. However, there is a peculiar condition required of a photoelectric conversion portion in an X-ray image pickup element that is used for both the still image photographing and the moving image photographing as described above. In order to satisfy this condition, a structure discussed below is employed in this embodiment.

First, in a photodiode having a pn junction, if a photoproduction carrier $Q_P$ is accumulated in the capacitor $C_{PD}$ of the photodiode portion and converted to a voltage, an optical signal voltage $V_P$ by the photoproduction carrier is represented by the following equation.

$$V_P = Q_P / C_{PD} \quad \text{(Equation 1)}$$

A reset noise is generated each time the photodiode is reset. This appears as a random noise. A reset noise $V_N$ is represented by the following equation.

$$V_N = \sqrt{(kTC_{PD})} \quad \text{(Equation 2)}$$

where, k is a Boltzmann constant and T is a temperature (K).

In addition, an S/N ratio is represented by the following equation.

$$V_P/V_N = Q_P \cdot \sqrt{(1/(kTC_{PD}))} \quad \text{(Equation 3)}$$

It is better to make an area of the photodiode large in order to have a large light utilization factor. However, when the area of the photodiode is made large, a capacitance of the capacitor $C_{PD}$ also becomes large. In order to obtain a maximum sensitivity (S/N ratio) in photographing a moving image, it is desirable to make the capacitance of the capacitor $C_{PD}$ of the photodiode as small as possible.

In addition, a magnitude $\Delta V$ of an output of a pixel amplifier having a floating diffusion amplifier structure is represented by the following equation.

$$\Delta V = G \cdot Q_P / C_{FD} \quad \text{(Equation 4)}$$

where, G is a gain of the source follower, $C_{FD}$ is a capacitance of the floating diffusion and $Q_P$ is signal charges accumulated in the capacitor $C_{FD}$.

As is evident from Equation 4, the larger $\Delta V$ is with respect to the same signal charges $Q_P$, the larger an electric charge/voltage conversion gain becomes. This is advantageous in terms of the S/N and the like. Since the gain G of the source follower changes little, usually in the order of 0.7 to 0.9, in order to make $\Delta V$ large with respect to the same signal charges $Q_P$, it is necessary to make the capacitance of the capacitor $C_{FD}$ as small as possible as in the photodiode.

Since a pixel is as large as 160 μm×160 μm in this embodiment, there is a limitation in making the capacitance of the capacitor $C_{PD}$ small at an appropriate opening ratio (an area of the photodiode). Although the capacitance of the capacitor $C_{PD}$ can be made small by employing a method of making an area of an electrode small without changing the area of the photodiode, this method reduces an efficiency of collecting electric charges in the electrode and makes it difficult to completely transfer signal charges to the floating diffusion by the transfer switch. In this embodiment, a design for not performing the complete transfer is employed, and the photodiode and the floating diffusion are directly connected to be a photoelectric conversion portion without providing the transfer switch. In addition, the capacitance of the capacitor $C_{PD}$ of the photodiode and the capacitance of the capacitor $C_{FD}$ of the floating diffusion are designed to be minimum such that a maximum sensitivity is realized in photographing a moving image.

In this embodiment, a kTC noise is generated when the photoelectric conversion portion is reset because the complete transfer is not performed. However, it is an important point for realizing a high S/N ratio of the photoelectric conversion portion to remove the kTC noise (reset noise) in terms of a circuit. Thus, in this embodiment, a structure in which a clamp circuit is provided for each pixel is employed. It is publicly known to use the clamp circuit for removing a kTC noise. If a size of a pixel is relatively small at 50 μm×50 μm to 100 μm×100 μm and the complete transfer is possible, this does not apply because a kTC noise is not generated in the photoelectric conversion portion.

This does not also apply if greater importance is attached to an FPN than a kTC noise in photographing a moving image as in the first embodiment. However, in order to have an image pickup element that is used for both the still image mode and the moving image mode, removal of a kTC noise is necessary even in the still image mode and it is indispensable to provide a clamp circuit in a pixel. In this embodiment, a clamp circuit is provided in a pre-stage of a sample hold circuit for collective exposure such that a kTC noise can be removed even in the moving image mode of collective exposure.

In addition, a larger capacitance of the capacitor $C_{PD}$ is better in order to make a dynamic range of a photodiode for photographing a still image large. However, if the capacitance of the capacitor $C_{PD}$ is large, an S/N ratio falls because a signal voltage falls. In this embodiment, in order to expand the dynamic range in photographing a still image while maintaining a maximum sensitivity in photographing a moving image, a sensitivity (dynamic range) changeover circuit is provided and a capacitor and a changeover switch are provided in each pixel. Since a capacitance increases in photographing a still image, the S/N ratio falls. In order to improve the S/N ratio, a clamp circuit for removing a kTC noise is particularly required.

Figure 15:
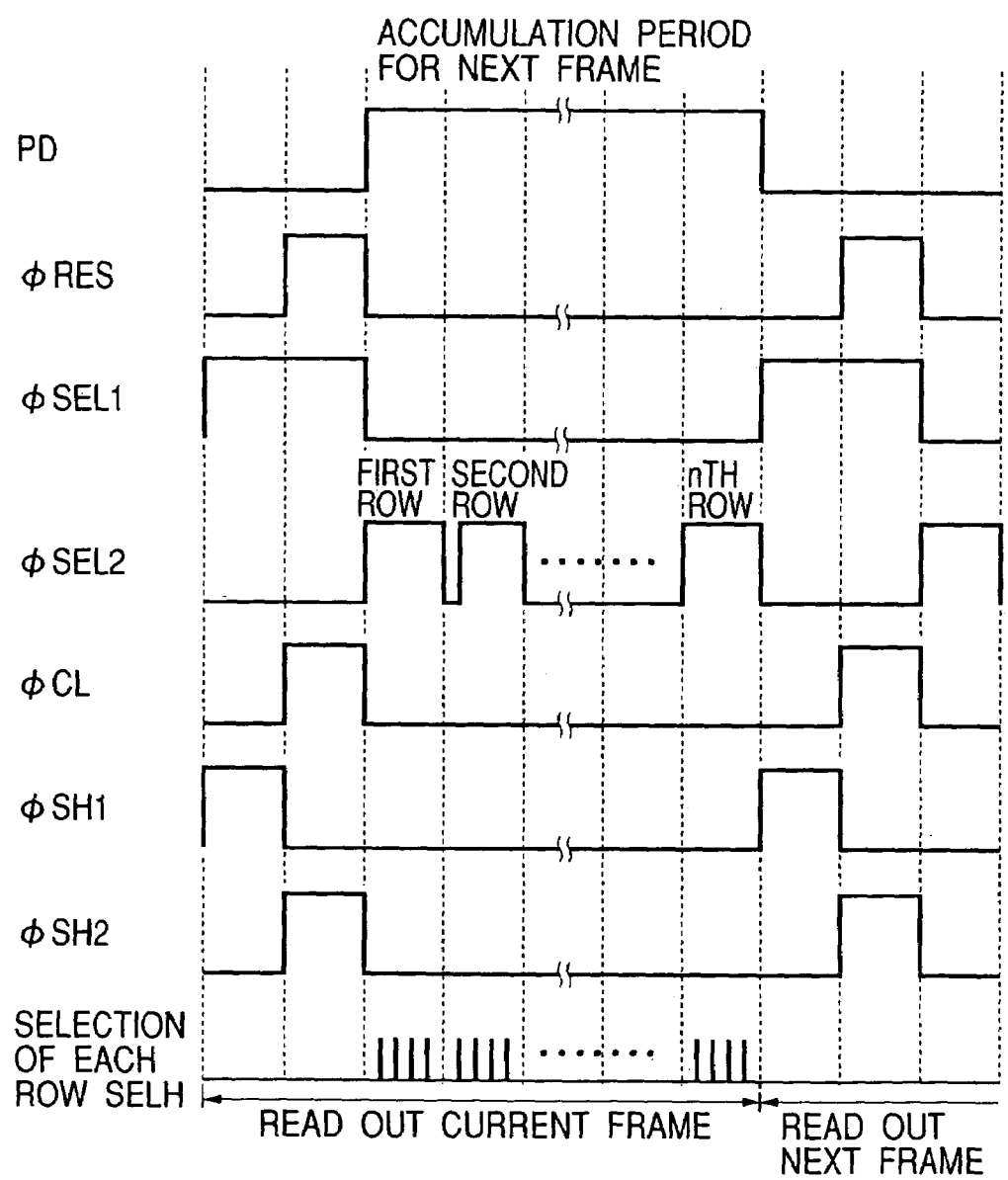
FIG. 15 is a timing chart showing operation timing of the embodiment of FIG. 14.

FIG. 15 is a timing chart showing operation timing of a pixel portion in this embodiment. A circuit operation will be hereinafter described with reference to FIG. 15. First, photoelectric conversion is performed in the photodiode PD. Exposure is collective exposure and is performed at identical timing and at an identical period in all pixels in each image pickup element. Thus, temporal deviation of images among image pickup elements and among scanning lines does not occur at all. In this embodiment, the pixel portion has a structure in which electric charges of the photodiode PD are not completely transferred to the floating diffusion and does not have a transfer switch. Photocharges generated in the photodiode PD are accumulated in the capacitors $C_{PD}$ and $C_{FD}$. A reset noise (kTC noise) at the end of the prior frame is contained in the photocharges. An operation from this state will be described. Note that a signal ΦSC is at low level in the moving image mode.

First, as indicated in FIG. 15, a signal ΦSEL1 from the vertical shift register VSR is changed to high level collectively for all the pixels, the selection switches M3 and M6 are turned on to convert the electric charges accumulated in the capacitors $C_{PD}$ and $C_{FD}$ to a voltage by the source follower constituting the pixel amplifier 1 (M4) and save it in the clamp capacitor $C_{CL}$. This clamp capacitor $C_{CL}$ is clamped to a reset level at which photocharges contain a reset noise of the photoelectric conversion portion at the time of resetting the prior frame. The photocharges containing the reset noise are held in the clamp capacitor $C_{CL}$, whereby an optical signal with the reset noise removed is outputted from the clamp capacitor $C_{CL}$.

In addition, as indicated in FIG. 15, a signal ΦSH1 is changed to high level simultaneously with the signal ΦSEL1 from the vertical shift register VSR and the sample switch M8 is turned on to collectively transfer the optical signal to the capacitor CH1 through the pixel amplifier 2 (M7). Subsequently, the signal ΦSH1 is changed to low level collectively for all the pixels and the sample switch M8 is turned on to finish holding of the optical signal charges in the sample hold circuit. Without a moment's delay, as indicated in FIG. 15, a signal of RES from the vertical shift register VSR is changed to high level collectively for all the pixels and the reset switch M2 is turned on to reset the floating diffusion $C_{FD}$.

At the same time, as indicated in FIG. 15, a signal ΦCL from the vertical shift register VSR is changed to high level. Then, the clamp switch M5 is turned on to set the clamp capacitor $C_{CL}$ to the reference voltage. Also, at the same time, as indicated in FIG. 15, the signal ΦSH2 from the vertical shift register VSR is changed to high level collectively for all the pixels. Then, the sample switch M11 is turned on to transfer the noise signal when set to the reference voltage to the capacitor CH2. Subsequently, the signal ΦSH2 is changed to low level collectively for all the pixels to end transfer of the optical signal and the noise signal to and holding of them in the sample hold circuit.

In addition, as indicated in FIG. 15, a signal ΦSEL2 is changed to high level for each column by a signal inputted in the vertical shift register VSR. Then the selection switches M9 and M12 are turned on to bring the source follower circuit constituted of the load current source and the pixel amplifiers 3 and 4 (M10 and M13) to an operation state. Consequently, the optical signal and the noise signal held in the holding capacitors CH1 and CH2 are transferred to a noise signal output line and an optical signal output line through the pixel amplifiers 3 and 4.

The signals transferred to the noise signal output line and the optical signal output line are subject to subtraction processing of (signal—noise) in a subtraction output amplifier (not shown) connected to the noise signal output line and the optical signal output line. At this point, since the optical signal and the noise signal are taken in the sample hold circuits from the pixel amplifier 2 at a very small time difference, 1/f noise which becomes large at low frequency can be removed and a high frequency component can be neglected. In addition, with this time difference, there is no dispersion of a threshold value Vth according to a temperature difference of an output stage source follower. Output charges accumulated in the holding capacitor are continuously obtained in terms of time in both the cases at the time of resetting and at the time of inputting signal charges for one pixel amplifier. By further taking the difference of both the outputs, a thermal noise, a 1/f noise and an FPN due to a temperature difference and process dispersion in the pixel amplifier can be removed.

In this way, the above-mentioned series of operations are repeated. The signal ΦSEL2 is changed to high level for each column and a signal SELH (not shown) is changed to high level for each row in the accumulation period, whereby a noise signal and an optical signal in a prior frame are outputted. The noise signal is subtracted from the optical signal by a not-shown subtraction amplifier, whereby the thermal noise, the 1/f noise, the fixed pattern noise (FPN) due to the temperature difference and dispersion of the process can be removed.

As described above, the collective exposure is performed after collective resetting of the photodiode PD is performed and the optical signal and the noise signal are accumulated in the sample hold circuit in the pixel, whereby exposure of the next frame and reading-out of these signals can be performed independently. Consequently, since it is possible to perform exposure while performing high-speed reading-out, even in multi-pixel driving and high-speed operation at a low irradiation amount as in a large area X-ray image pickup apparatus, it is possible to take accumulation time as long as possible, make an optical signal intensity large, further perform noise reduction and improve the signal-noise ratio (S/N).

Figure 16:
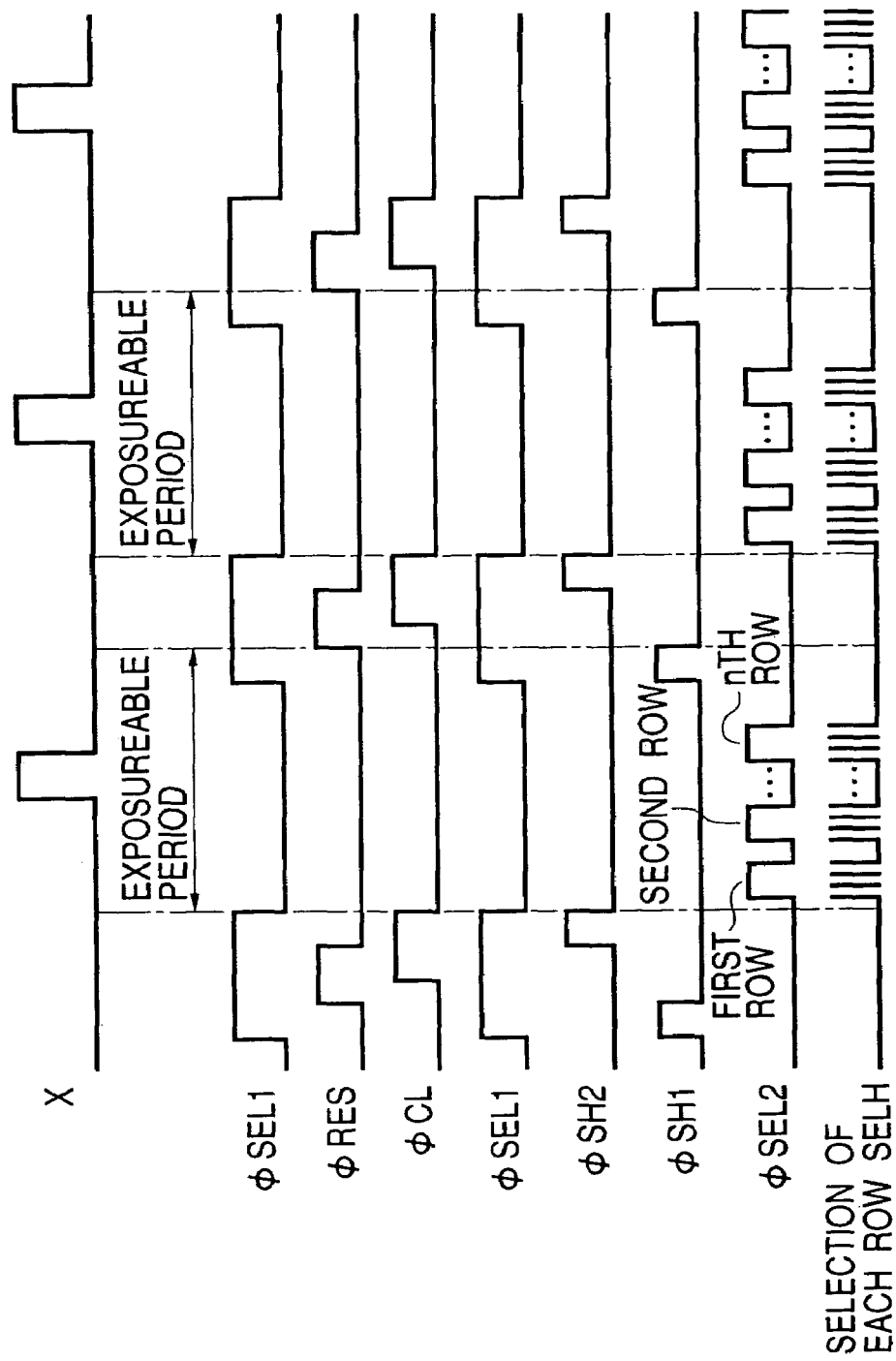
FIG. 16 is a timing chart showing operation timing of the embodiment of FIG. 14.

Although the structure for always outputting X-rays in a moving image photographing is described above, it is also possible to perform photographing by pulse-irradiating X-rays. That is, as shown in FIG. 16, X-rays are irradiated during an exposable period.

On the other hand, in the still image mode, at the stage in which the signal ΦSC is changed to high level and the capacitor C1 is connected in parallel to the photodiode PD, the same operations as described above are performed In this case, since the capacitor C1 is given a capacitance almost ten times as large as that of the capacitor $C_{FD}$, a wide dynamic range can be realized. In addition, a kTC noise in the photoelectric conversion portion can be removed for each pixel by the clamp circuit. Moreover, sample hold circuits for accumulating optical signals and for accumulating noise signals are provided in a pixel, whereby a thermal noise, a 1/f noise and an FPN due to a temperature difference and process dispersion in the pixel amplifier can be removed. Consequently, in the moving image mode, high-speed and high sensitivity moving image photographing that is substantially seamless in terms of time and space can be realized by nine image pickup elements. On the other hand, in the still image mode, still image photographing of high sensitivity and high dynamic range can be realized.

<Third Embodiment>

Figure 17:
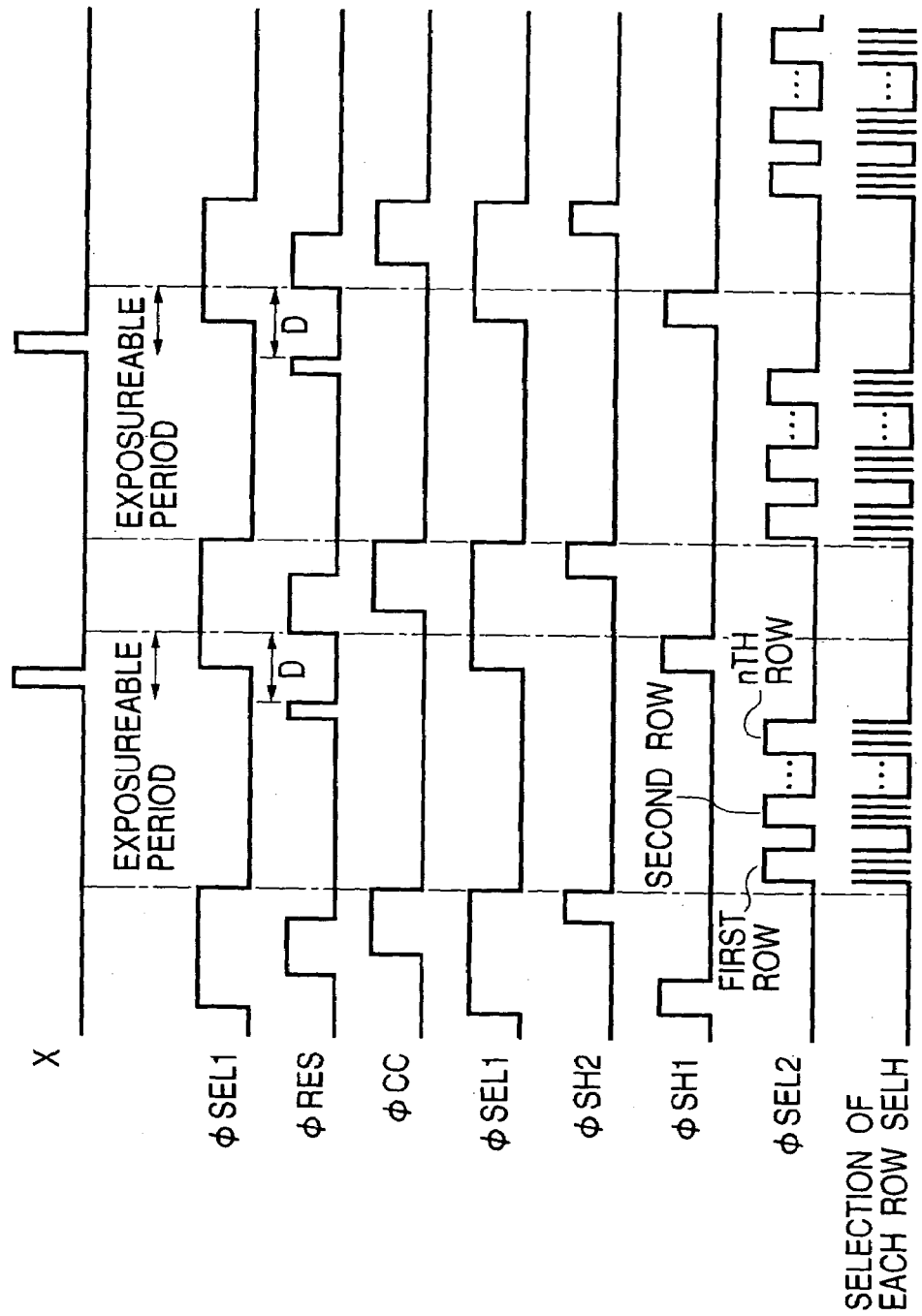
FIG. 17 is a timing chart of a third embodiment of the image pickup apparatus according to the present invention.

FIG. 17 is a timing chart showing another driving timing of an image pickup apparatus having the pixel structure of the second embodiment described above.

As shown in FIG. 17, in this embodiment, a reset pulse RS of a pixel is added immediately before an X-ray pulse. Accumulation of a dark current can be made shorter in time in this embodiment.

<Fourth Embodiment>

Figure 18:
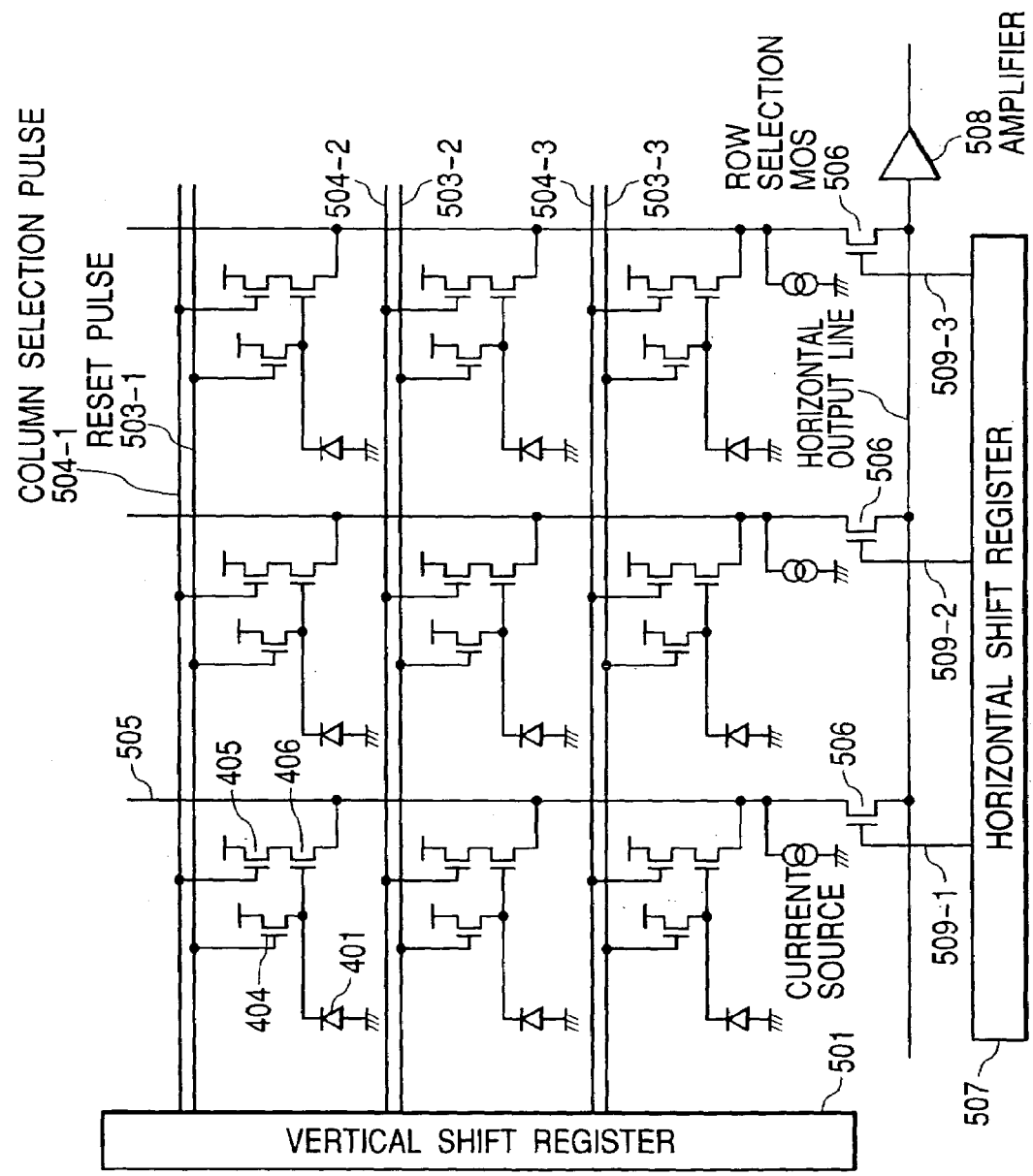
FIG. 18 is a view showing a structure of a pixel portion constituting each pixel of a CMOS type image pickup element.

FIG. 18 shows a structure of a pixel portion constituting each pixel of a CMOS type image pickup element. Reference numeral 401 denotes a photodiode (PD) for performing photoelectric conversion, 404 denotes a MOS transistor (pixel reset switch) for resetting electric charges accumulated in the photodiode 401, and 406 denotes an amplification MOS transistor (pixel amplifier) functioning as a source follower amplifier for transferring electric charges generated by the photodiode to a vertical transfer line (output line) 505. A column selection MOS transistor 405 performs column selection of a pixel from which an image pickup signal is read out (column selection switch). A row selection MOS transistor 506 selects an image pickup signal read out in the column selection for each row (row selection switch). In addition, there is an amplifier 508 as a buffer for supplying the image pickup signal read out in the row selection to the outside of the image pickup element. The amplification MOS transistor 406 and the column selection MOS transistor constitute outputting means.

Further, a gate of the pixel reset switch 404 is connected from a vertical shift register 501 to a reset pulse 503. A gate of the column selection switch 405 is connected to a column selection pulse 504 from the vertical shift register 501 functioning as a vertical scanning circuit. A gate of the row selection switch 506 is connected to a horizontal shift register 507.

Figure 19:
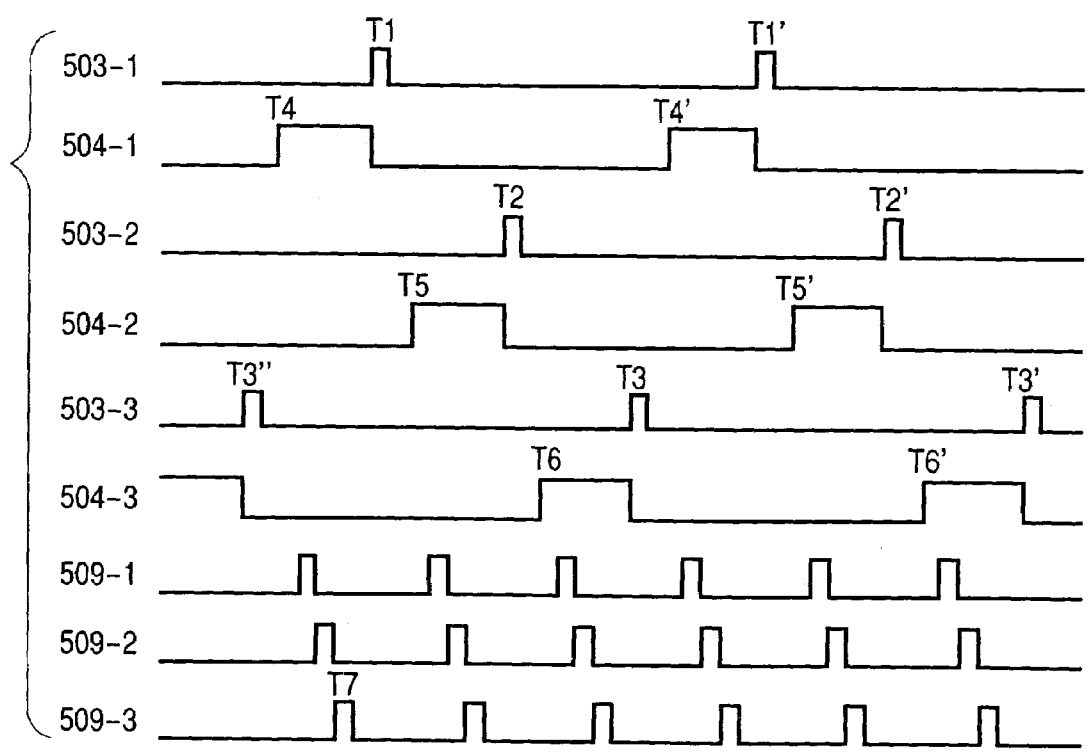
FIG. 19 is a timing chart for describing driving timing of the image pickup element of FIG. 18.

Next, driving timing of the above-mentioned image pickup element will be described with reference to FIG. 19. Note that, X-rays are continuously irradiated.

First, a column selection pulse 504-1 is changed to high level at T4 when exposure time for object photographing has elapsed, whereby a group of column selection MOS transistors 405 of a pertinent column is turned on and an image pickup signal is read out to the vertical transfer line 505 via the pixel amplifier 406. The image pickup signal for one column read out in this way is read out to the outside of the image pickup element via an amplifier 508 as row selection pulses 509-1, 509-2 and 509-3 are sequentially turned on by the horizontal shift register 507. Thereafter, a reset pulse 503-1 is changed to high level at T1 and a group of reset MOS transistors 404 on the first row is turned on, whereby the electric charges accumulated in the photodiode 401 of the pertinent column are reset to a predetermined level. Further, an exposure period of the first column is from completion (not shown) of the reset pulse 503-1 at the previous reading-out time until completion T4 of the column selection pulse 504-1 (a period of the same length as a period from completion T1 of the reset pulse 503-1 at the reading-out time until completion T4' of the column selection pulse 504-1).

Reading-out of an image pickup signal to the vertical transfer line 505 by a column selection pulse 504-2 of the next column must be performed after the row selection pulse 509 of the previous column is completed, that is, after T7. In addition, an exposure period of a second column is from completion (not shown) of a reset pulse 503-2 at the previous reading-out time until completion of a column selection pulse 504-2 at T5 (a period of the same length as a period from completion T2 of the reset pulse 503-2 at the reading-out time until completion T5' of the column selection pulse 504-1). Consequently, resetting of a photodiode in the second column is executed as the reset pulse 503-2 is changed to high level at T2 that is later than a reset pulse in T1 of the previous column and a group of reset MOS transistors is turned on. A reading-out sequence after the resetting is the same as the first column.

Pixel resetting of a third column is performed by a reset pulse 503-3 from T3 that is later than T2. An exposure period in this case is from completion T3" of the reset pulse 503-3 until completion of a column selection pulse 504-3 of T6.

Therefore, exposure of an image by this image pickup element is delayed in time for each line. As a result, deviation from the actual time occurs in the case of a moving object.

Figure 20:
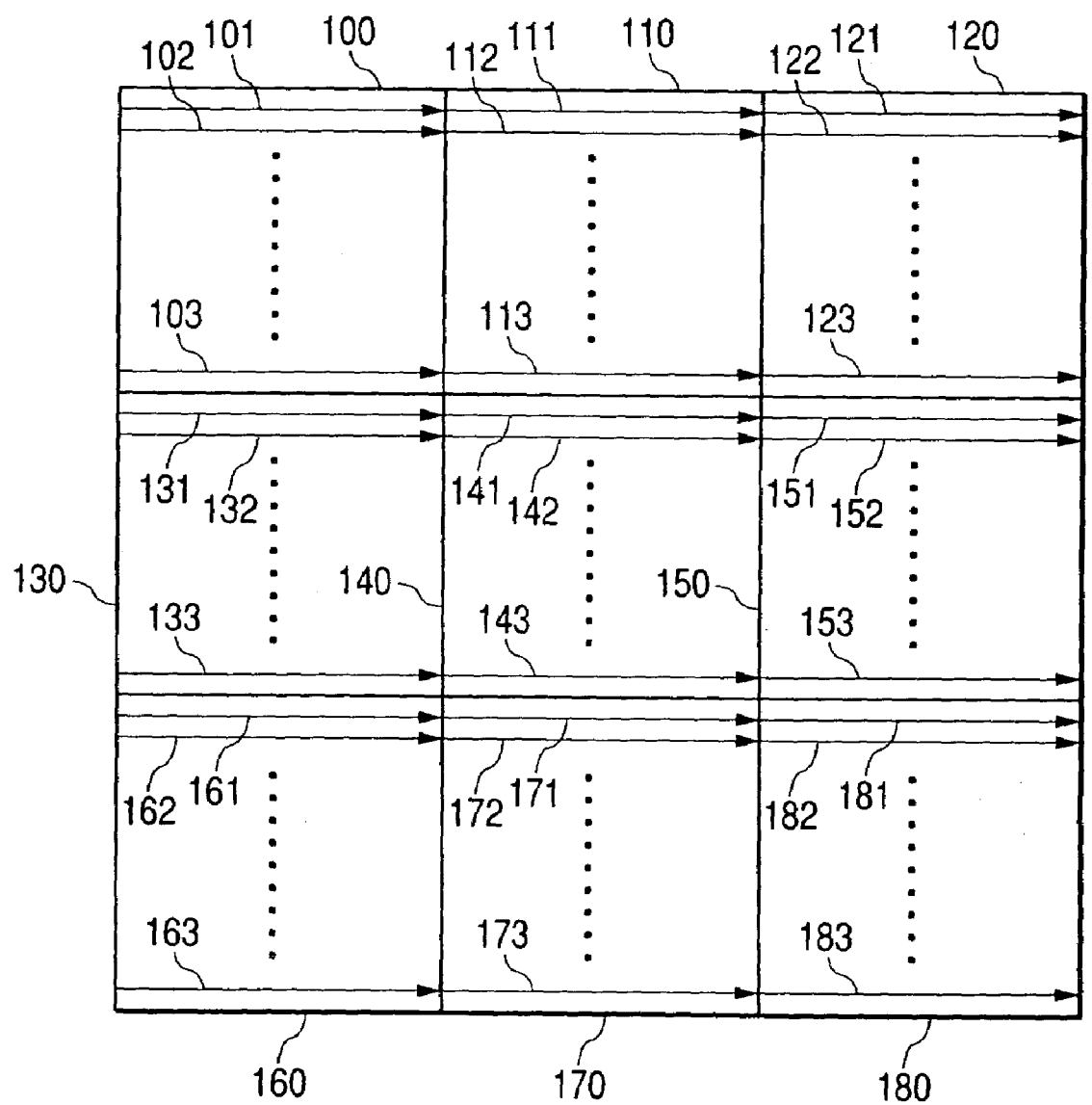
FIG. 20 is a view of an image pickup apparatus constituted in large size using nine image pickup elements.

Moreover, in order to describe temporal deviation of an moving image among image pickup elements in line sequential scanning, an example in which an image pickup apparatus is constituted using nine image pickup elements described above is shown in FIG. 20.

Here, reference numerals 100, 110, 120, 130, 140, 150, 160, 170 and 180 denote image pickup elements for performing the line sequential scanning in the above-mentioned structure. Reference numerals 101 to 103 denote scanning lines of the image pickup element 100, 111 to 113 denote scanning lines of the image pickup element 110, 121 to 123 denote scanning lines of the image pickup element 120, 131 to 133 denote scanning lines of the image pickup element 130, 141 to 143 denote scanning lines of the image pickup element 140, 151 to 153 denote scanning lines of the image pickup element 150, 161 to 163 denote scanning lines of the image pickup element 160, 171 to 173 denote scanning lines of the image pickup element 170, and 181 to 183 denote scanning lines of the image pickup element 180. Note that arrows indicate a reading direction of an image pickup signal. Further, exposure for image pickup is started from the first scanning lines of the image pickup elements 100, 110, 120, 130, 140, 150, 160, 170 and 180 (corresponding to the scanning line 101 in the image pickup element 100) simultaneously for nine image pickup elements.

With the scanning in these image pickup elements, deviation of image pickup exposure timing occurs between the image pickup exposure time of the first scanning line and the last scanning line. For example, in the image pickup element 100, image pickup exposure timing of the scanning line 102 is later than image pickup exposure timing of the scanning line 101, and image pickup exposure timing of the scanning line 103 is later than image pickup exposure timing of the scanning line 101 by substantially one frame time. Therefore, temporal deviation of exposure, which occurs among the scanning lines in the image pickup element for picking up an image of a moving object, affects an image.

Moreover, since a difference of substantially one frame time occurs between the scanning line 131 of the image pickup element 130 and the scanning line 103 of the image pickup element 100 in the above-mentioned structure, connection of moving images becomes unnatural in a tessellating part of the image pickup elements 100 and 130 when an image of a moving object is picked up. It is needless to mention that moving images become also unnatural in borders between the image pickup elements 130 and 160, the image pickup elements 110 and 140, the image pickup elements 140 and 170, the image pickup elements 120 and 150 and the image pickup elements 150 and 180.

As described above, since the CMOS type image pickup element that can be made in a large size by tessellating image pickup elements together usually performs line sequential scanning, temporal deviation occurs with respect to a moving object. This temporal deviation is particularly conspicuous in a border between image pickup elements.

FIG. 4 shows an example of the case where a large area radiation moving image pickup apparatus of 414 mm×414 mm is constituted by tessellating nine image pickup elements of 138 mm×138 mm together. Nine image pickup elements 602 are stuck together on a base to constitute an image pickup apparatus of a large screen as a whole.

In the radiation moving image pickup apparatus of the above-mentioned structure, a light receiving area is made in an equal size and the centers of gravity of the light receiving areas are arranged at an equal pitch in each image pickup element and among image pickup elements, whereby dispersion of sensitivity and dispersion of the center of gravity of a light receiving area do not occur in each image pickup element and among image pickup elements, even if a shift register or the like is disposed in the effective area. Thus, it is possible to obtain an image that is substantially seamless even in a structure in which image pickup elements are tessellated. In addition, since pixels are arranged in an end portion area of an image pickup element and a dead space due to a shift register and the like is not generated, the entire surface of the image pickup element becomes an effective area.

Figure 21:
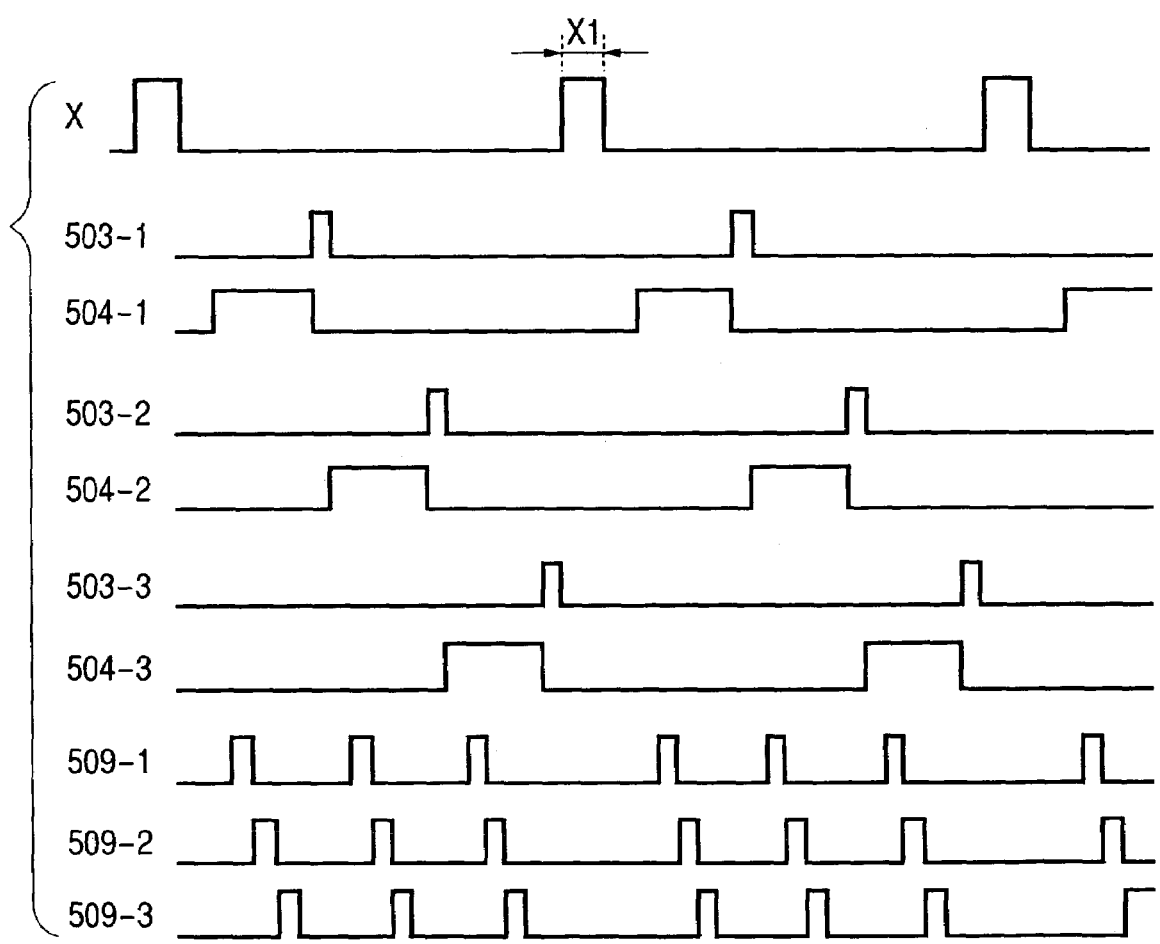
FIG. 21 is a timing chart showing driving timing of the image pickup element of FIG. 18.

According to this embodiment, as shown in FIG. 21, X-rays are generated in a pulse shape, whereby an image of each column in one frame becomes an image over a period of X1 and each pixel column of an image pickup element is simultaneously exposed. In addition, there is no deviation of an image even in an apparatus in which a plurality of image pickup elements are tessellated together. Moreover, a moving image can be observed and, at the same time, there is little unsharpness when each frame is observed one by one. Therefore, a favorable image can be obtained even if a heart and the like are photographed.

<Fifth Embodiment>

Figure 22:
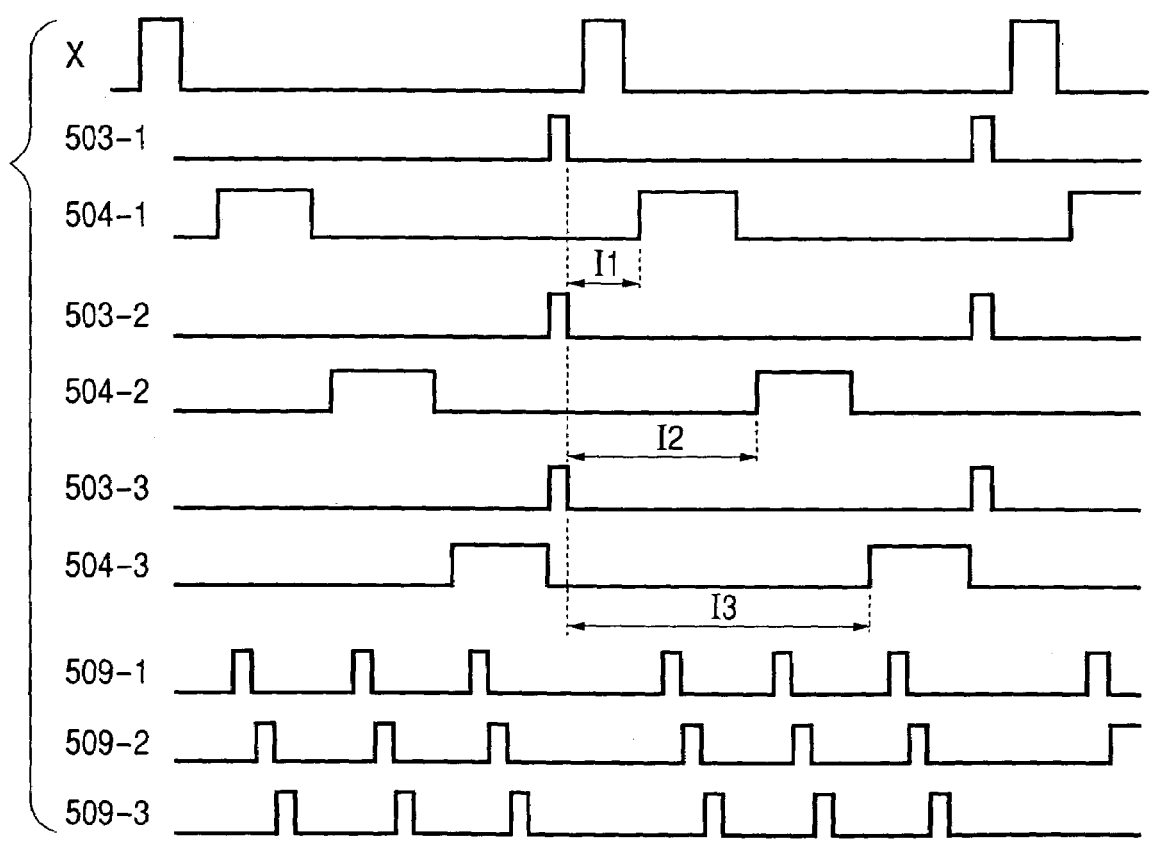
FIG. 22 is a timing chart showing driving timing of the image pickup element of FIG. 18.

FIG. 22 is a timing chart showing driving timing according to a fifth embodiment of the present invention. A structure of an image pickup element is the same as the structure described in the fourth embodiment.

As shown in FIG. 22, resetting of each pixel is performed collectively coinciding with reset timing of a last column and then, X-rays are generated in a pulse shape. By such an operation, accumulation of a dark current of a sensor is limited to periods of I1, I2 and I3 and average dark current accumulation is reduced, whereby a shot noise accompanying the dark current becomes small and satisfactory.

<Sixth Embodiment>

Figure 23:
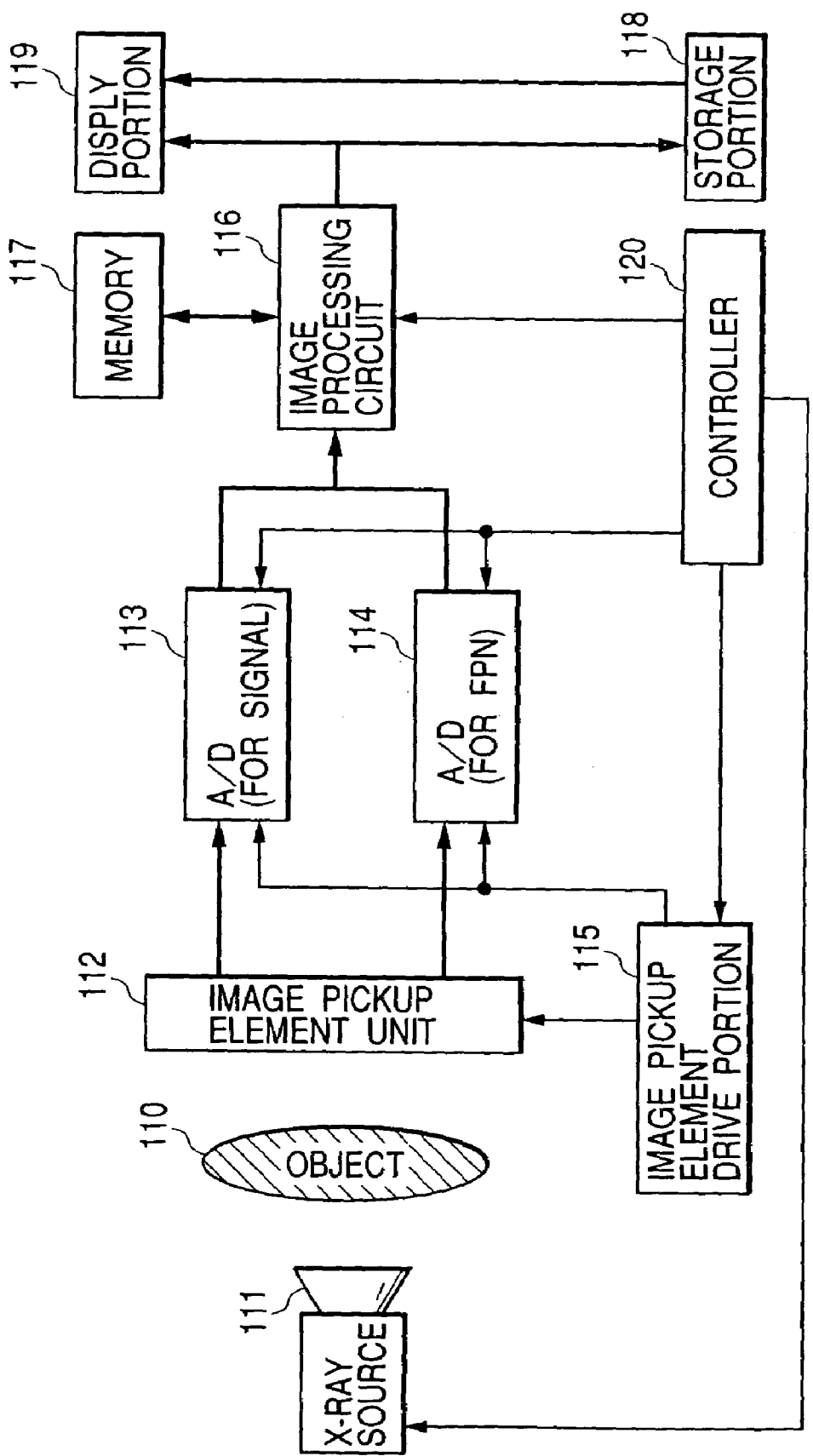
FIG. 23 is a block diagram showing an embodiment of a radiographic apparatus of the present invention.

FIG. 23 is a block diagram showing an entire structure of a case where a radiographic apparatus is constituted using the image pickup elements containing pixels described in the first to the fifth embodiments. In FIG. 23, radiation is irradiated on an object (e.g., a chest of a human) 110 from an X-ray source 111 and radiation transmitted through the object 110 is incident on an image pickup element unit 112. Nine image pickup elements of the first or the fifth embodiment are tessellated to form the image pickup element unit 112. Further, the image pickup element unit 112 is constituted by a scintillator for converting X-rays to visible light, an X-ray shielding member, a peripheral driving circuit and the like. The pixels of the image pickup elements have a structure of the first to the fifth embodiments. In addition, a radiographic apparatus can be constituted by combining a scintillator with the radiographic apparatus.

A signal of 4×8 system (a signal outputted by 9×2 output lines from nine image pickup elements) from the image pickup element unit 112 is converted from an analog signal to a digital signal by an A/D converter 113 for signal and an A/D converter 114 for FPN. An image pickup element drive portion 115 is implemented adjacent to the image pickup element unit 112. An A/D converted signal is sent to an image processing circuit 116. Composition of image signals of the nine image pickup elements, correction of a defective noise and the like are performed by the image processing circuit 116 and a memory 117. The processed signal is recorded in a storage portion 118 or displayed on a display portion (monitor) 119 and printed if necessary. These circuits and devices are subject to overall control by a controller 120. Moreover, the controller 120 performs control of timing and the like between the X-ray source 111 and the image pickup elements.

The memory signal temporarily stored in the memory 117 is subject to image processing (gamma processing, interpolation processing and the like) for composing each image pickup element signal as one image (image processing circuit 116), its output is stored in a large scale image memory and a memory output is displayed on the display portion 119 or the like. As the photographing ends, the image processing ends simultaneously. The data captured in the image pickup apparatus is transferred to a personal computer and the like, where the data is subject to software processing and the like for analyzing an object.

Further, such an image processing method can be performed based on a program that is stored in a computer such as a personal computer. In addition, the present invention includes an information recording medium such as a CD-ROM having such a program recorded therein. The computer can execute the image processing method in accordance with the present invention by reading the program recorded in the CD-ROM or the like.

Figure 24:
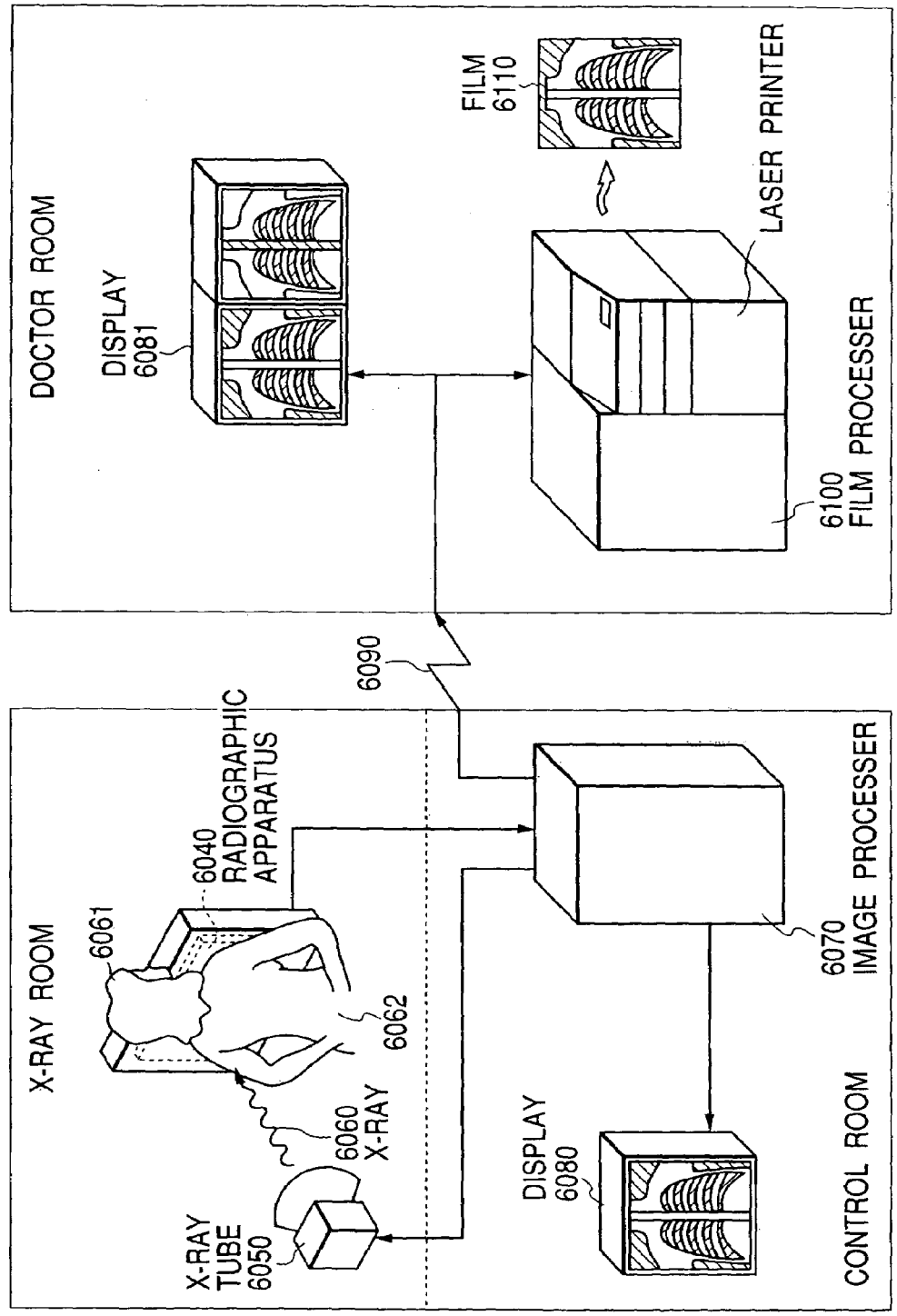
FIG. 24 is a view showing an embodiment of a radiographic system of the present invention.

FIG. 24 is a view showing an example in the case where an X-ray image pickup system is constituted using the image pickup apparatus described above. In FIG. 24, X-rays 6060 generated by an X-ray tube 6050 are transmitted through a chest 6062 of a patient or an object 6061 and are incident on a radiographic apparatus 6040 including a scintillator, an FOP, image pickup elements, an external processing substrate and the like. The incident X-rays contain information on internal organs of the patient 6061. The scintillator emits light in response to the incidence of the X-rays and the image pickup elements photoelectrically convert the emitted light, whereby electric information is obtained. This information is converted to a digital signal, which is subject to image processing by an image processor 6070 and can further be observed by a display 6080 in a control room.

In addition, this information can be transferred to a remote place by transmitting means such as a telephone line 6090 and can be displayed on a display 6081 in a doctor room or the like in another location or saved in saving means such as an optical disc. Thus, a doctor in the remote place can examine the patient. Further, this information can be recorded in a film 6110 by a film processor 6100.

What is claimed is:

1. An image pickup apparatus comprising:
   a plurality of image pickup elements, each element having pixels arranged in a two-dimensional state, and each pixel having a photoelectric conversion portion, a first holding portion for holding a photoelectric conversion signal generated in the photoelectric conversion portion, and a second holding portion for holding a noise signal generated in the pixel; and a driving circuit for collectively applying a first signal and a second signal to the pixels of said plurality of image pickup elements;

wherein the first signal is collectively applied to all of the pixels of said plurality of image pickup elements for transferring the photoelectric conversion signals generated in the photoelectric conversion portion of each of the pixels to the first holding portion of each of the pixels, and the second signal is collectively applied to all of the pixels of said plurality of image pickup elements for transferring the noise signals generated in the pixels to the second holding portion of each of the pixels.

2. An image pickup apparatus according to claim 1, wherein the pixel has a photoelectric conversion portion and an amplification element for amplifying to output a signal from the photoelectric conversion portion, and wherein the first and second holding portions are provided in parallel with each other and are provided on an output side of the amplification element.

3. An image pickup apparatus according to claim 1, further comprising a mode for accumulating photocharges in the photoelectric conversion portion during a period in which signals held in the first and second holding portions of each of the pixels arranged in a two-dimensional state are sequentially read out.

4. An image pickup apparatus according to claim 3, further comprising a switch for adding a capacitance to the photoelectric conversion portion in parallel thereto.

5. An image pickup apparatus according to claim 1, wherein the number of the image pickup elements arranged in plural and an object image is picked up by said plurality of image pickup elements.

6. An image pickup apparatus according to claim 1, further comprising a radiation source for generating radiation to be irradiated on said image pickup element at a predetermined interval.

7. An image pickup apparatus according to claim 6, further comprising a scintillator for converting radiation to visible light.

8. An image pickup apparatus according to claim 7, further comprising:

an image processing circuit for applying image processing to a signal from said image pickup element; and a display for displaying an image to which the image processing is applied by said image processing circuit.

9. An image pickup apparatus comprising:

a plurality of image pickup elements, each element having pixels arranged in a two-dimensional state, and each pixel having a photoelectric conversion portion, a first holding portion for holding a photoelectric conversion signal generated in the photoelectric conversion portion, and a second holding portion for holding a noise signal generated in the pixel; and a driving circuit for collectively applying a first signal and a second signal to the pixels of said plurality of image pickup elements;

wherein the first signal is collectively applied to all of the pixels of said plurality of image pickup elements for transferring the photoelectric conversion signals generated in the photoelectric conversion portion of each of the pixels to the first holding portion of each of the pixels, and the second signal is collectively applied to all of the pixels of said plurality of image pickup elements for transferring the noise signals generated in the photoelectric portion of each of the pixels to the second holding portion of each of the pixels, and wherein each of the plurality of pixels has a first amplifier for reading out an output from the first holding portion and a second amplifier for reading out an output from the second holding portion.

10. An image pickup apparatus according to claim 9, wherein the first amplifier forms a first source follower circuit with a load current source, the second amplifier forms a second source follower circuit with a load current source, and the first source follower circuit and the second source follower circuit are connected with a calculating amplifier capable of executing a subtracting process.

11. An image pickup apparatus according to claim 9, wherein one of the pixels has a third amplifier between the first amplifier and the second amplifier.

* * * * *

UNITED STATES PATENT AND TRADEMARK OFFICE
CERTIFICATE OF CORRECTION

| | | |
|---|---|---|
| PATENT NO. | : 7,129,500 B2 | |
| APPLICATION NO. | : 10/917400 | |
| DATED | : October 31, 2006 | |
| INVENTOR(S) | : Kazuaki Tashiro et al. | |

It is certified that error appears in the above-identified patent and that said Letters Patent is hereby corrected as shown below:

SHEET 22 IN THE DRAWINGS:

Figure 23, "DISPLY" should read --DISPLAY--.

COLUMN 1:

Line 40, "etc." should read --etc.,--.

COLUMN 6:

Line 22, "is" should read --are--; and
Line 62, "medial" should read --medical--.

COLUMN 8:

Line 34, "an" should read --a--.

COLUMN 10:

Line 18, "length t" should read --length L--; and
Line 30, "is" should read --are--.

COLUMN 11:

Line 38, "this" should read --these--.

UNITED STATES PATENT AND TRADEMARK OFFICE
CERTIFICATE OF CORRECTION

PATENT NO. : 7,129,500 B2
APPLICATION NO. : 10/917400
DATED : October 31, 2006
INVENTOR(S) : Kazuaki Tashiro et al.

It is certified that error appears in the above-identified patent and that said Letters Patent is hereby corrected as shown below:

COLUMN 18:

Line 54, "performed" should read --performed.--.

Signed and Sealed this

Eighteenth Day of November, 2008

JON W. DUDAS
*Director of the United States Patent and Trademark Office*